United States Patent
Chou et al.

(10) Patent No.: US 10,029,919 B2
(45) Date of Patent: Jul. 24, 2018

(54) MULTICRYSTALLINE SILICON BRICK AND SILICON WAFER THEREFROM

(71) Applicant: SINO-AMERICAN SILICON PRODUCTS INC., Hsinchu (TW)

(72) Inventors: Hung-Sheng Chou, Hsinchu (TW); Yu-Min Yang, Hsinchu (TW); Wen-Huai Yu, Hsinchu (TW); Sung Lin Hsu, Hsinchu (TW); Wen-Ching Hsu, Hsinchu (TW); Chung-Wen Lan, Taipei (TW); Yu-Ting Wong, Taichung (TW)

(73) Assignee: SINO-AMERICAN SILICON PRODUCTS INC., Hsinchu (TW)

( * ) Notice: Subject to any disclaimer, the term of this patent is extended or adjusted under 35 U.S.C. 154(b) by 470 days.

(21) Appl. No.: 14/698,615

(22) Filed: Apr. 28, 2015

(65) Prior Publication Data

US 2015/0307361 A1    Oct. 29, 2015

(30) Foreign Application Priority Data

Apr. 29, 2014   (TW) .............................. 103115312 A

(51) Int. Cl.
| | | |
|---|---|---|
| *C30B 29/06* | (2006.01) | |
| *C01B 33/02* | (2006.01) | |
| *C30B 29/64* | (2006.01) | |

(52) U.S. Cl.
CPC .............. *C01B 33/02* (2013.01); *C30B 29/06* (2013.01); *C30B 29/64* (2013.01)

(58) Field of Classification Search
CPC .......... C01B 33/02; C30B 29/06; C30B 29/64
See application file for complete search history.

(56) References Cited

U.S. PATENT DOCUMENTS

| 4,343,830 A | 8/1982 | Sarma et al. |
|---|---|---|
| 7,347,897 B2 | 3/2008 | Kato et al. |
| (Continued) | | |

FOREIGN PATENT DOCUMENTS

| CN | 100440438 C | 12/2008 |
|---|---|---|
| CN | 103088403 A | 5/2013 |
| (Continued) | | |

OTHER PUBLICATIONS

Wong et al., "Development of grain structures of multi-crystalline silicon from randomly orientated seeds in directional solidification", Journal of Crystal Growth, vol. 387, 2014, pp. 10-15.*

(Continued)

*Primary Examiner* — Jonathan C Langman

(74) *Attorney, Agent, or Firm* — Muncy, Geissler, Olds & Lowe, P.C.

(57) ABSTRACT

Present disclosure provides a multicrystalline silicon (mc-Si) brick, including a bottom portion starting from a bottom to a height of 100 mm, a middle portion starting from the height of 100 mm to a height of 200 mm; and a top portion starting from the height of 200 mm to a top. A percentage of incoherent grain boundary in the bottom portion is greater than a percentage of incoherent grain boundary in the top portion. Present disclosure also provides a multicrystalline silicon (mc-Si) wafer. The mc-Si wafer includes a percentage of non-Σ grain boundary from about 60 to about 75 and a percentage of Σ3 grain boundary from about 12 to about 25.

7 Claims, 33 Drawing Sheets

(26 of 33 Drawing Sheet(s) Filed in Color)

(56) References Cited

U.S. PATENT DOCUMENTS

| | | | | |
|---|---|---|---|---|
| 2004/0072393 A1* | 4/2004 | Yamazaki | ............ | H01L 21/2022 438/149 |
| 2005/0269569 A1* | 12/2005 | Kokubo | .............. | H01L 21/2022 257/59 |
| 2010/0193664 A1* | 8/2010 | Stoddard | ................. | C30B 11/14 249/114.1 |
| 2011/0142730 A1* | 6/2011 | Lan | ......................... | C30B 28/06 422/245.1 |
| 2012/0248455 A1* | 10/2012 | Van Gestel | ......... | H01L 21/0237 257/75 |
| 2013/0008371 A1 | 1/2013 | Tsuzukihashi et al. | | |

FOREIGN PATENT DOCUMENTS

| | | | | |
|---|---|---|---|---|
| JP | 2007022815 A | | 2/2007 | |
| JP | 2008-050194 | * | 3/2008 | ............. C30B 29/06 |
| JP | 2011201737 A | | 10/2011 | |

OTHER PUBLICATIONS

Machine english translation of JP2008-050194 provided by the Espacenet website, internet retrieval date of Mar. 19, 2018.*
Y.T.Wong et. al, Development of grain structures of multi-crystalline silicon from randomly orientated seeds in directional solidification, Journal of Crystal Growth 387(2014)10-15.
Chinese Office Action dated Mar. 13, 2018 with corresponding Chinese Application No. 201510208262.1, with partial English translation (4 pages).

* cited by examiner

MULTICRYSTALLINE SILICON BRICK AND SILICON WAFER THEREFROM

BACKGROUND

Multi-crystalline silicon (mc-Si) grown by directional solidification has attracted much attention in photovoltaic industry because of its low production cost and high throughput. However, the crystal quality deteriorates as the ingot grows taller due to the accumulation of impurities and the generation (multiplication) of dislocations. Because these defects, as well as crystal properties, are affected by grain morphologies and lattice orientations, the control of grain structures is important during crystal growth.

Different from random grain boundaries, special grain boundaries are characterized by particular misorientation and extensive areas of good fit (special grain boundaries are described by a sigma number ($1<\Sigma<29$), which is defined as the reciprocal of the fraction of lattice points in the boundaries that coincide between the two adjoining grains on the basis of the coincident site lattice (CSL) model.). Thus, there is low distortion of atomic bonds and relatively little free volume for special grain boundaries and consequently low boundary energy.

BRIEF DESCRIPTION OF THE DRAWINGS

The file of this patent or application contains at least one drawing executed in color. Copies of this patent or patent application publication with color drawings will be provided by the Patent and Trademark Office upon request and payment of the necessary fee.

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
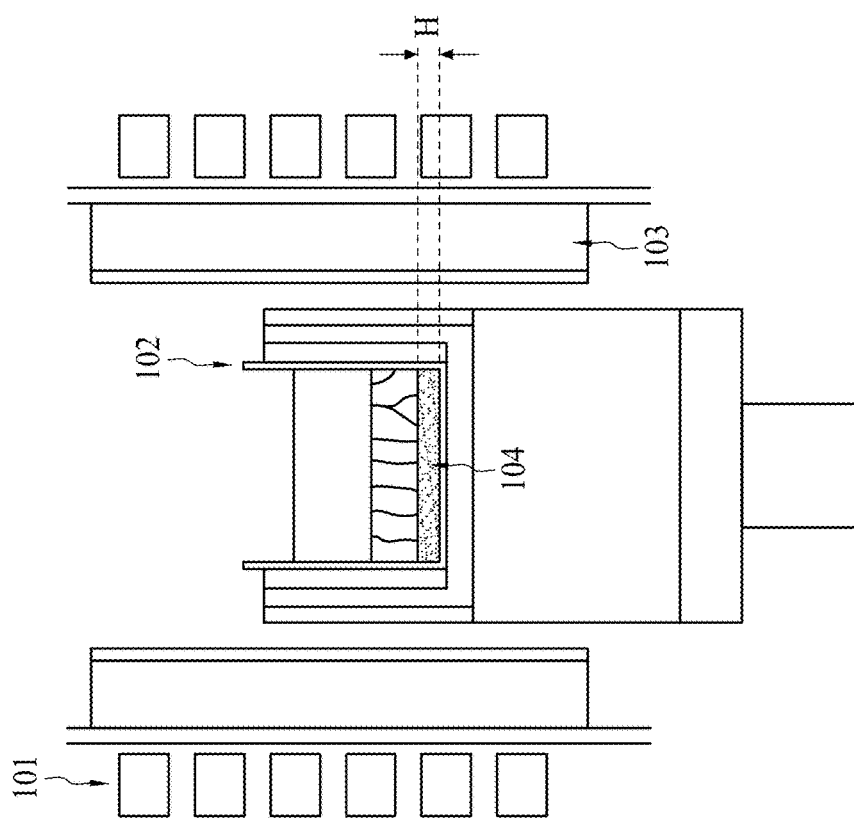
FIG. 1A is a schematic illustration of the experimental setup, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In some embodiments of the present disclosure, special grain boundaries with sigma numbers smaller than or equal to 3 are referred to as coherent grain boundaries. On the other hand, special grain boundaries with sigma numbers greater than 3 are referred to as incoherent grain boundaries, and special grain boundaries with sigma numbers greater than 27 are referred to as non-sigma grain boundaries. In some embodiments, the incoherent grain boundaries and the non-sigma grain boundaries are collectively called "non-coherent grain boundary".

In some embodiments of the present disclosure, a silicon brick is a portion of a silicon ingot. For example, a silicon brick can be a 156 mm by 156 mm column separated from a silicon ingot. In some cases, a silicon ingot can be divided into a 5 by 5 silicon brick array. For an industrial practice, each of the silicon brick can be further sliced into about 600 silicon wafers. Polysilicon has a melting point of about 1,414 degrees Celsius, and the aforesaid separation operation of the silicon brick from the silicon ingot or the silicon wafer from the silicon brick can only generate frictional heat lower than about 100 degrees Celsius. Hence, said separation can be considered as pure physical change (decrease in dimension) without the involvement of any chemical change, for a chemical change can only occurs at a temperature in proximity to the melting point of the silicon.

In some embodiments of the present disclosure, three portions of a silicon ingot, or a silicon brick separated from a silicon ingot, can be identified according to a height of the ingot or brick. Generally, a brick of an ingot can be equally divided into three portions. In some embodiments, a bottom portion ranges from a bottom to a height of 100 mm; a middle portion ranges from the height of 100 mm to a height of 200 mm; and a top portion ranges from the height of 200 mm to a top. Various crystal properties such as coherency of grain boundary, grain orientations, or grain size can be separately characterized according to different aforesaid portions.

The simplest way to control crystal structure is to use seeds with given orientations, and the use of mono-crystalline seeds has become popular in recent years for the production of the so-called mono-like or quasi-mono ingots. Unfortunately, the grain competition and new grain formation may spoil the structures and reduce the production yield. Therefore, it is believed that using a preferred growth orientation for directional solidification could increase the structure yield and reduce defect density. This issue can be discussed based on the twin formation mechanisms, and concluded that {100} orientation turned out to be the most difficult one to the growth of mono-like ingots.

To obtain better crystal properties in mc-Si growth, one of the approaches is the so-called dendrite casting method, which controls the initial undercooling to induce [110]/[112] dendrites and Σ3 grain boundaries. However, the control of undercooling is not so easy in a commercial growth station due to the large thermal resistance from the thick bottom of the quartz crucible and the imperfect nitride coating. This thus limits the applications of the method for mass production.

For growing mc-Si, it is found that the grains seemed to be oriented randomly, but the relative grain orientation could be described mostly by special coincidence orientations. This indicated that the grain structure developed from far fewer independent nuclei that were decided at the initial stage of nucleation and crystal growth. It is believed that {111} was the preferred growth orientation for silicon due to the smaller interfacial energy. The melt growth behavior of mc-Si using an in situ monitoring system during a thin-film directional solidification was studied, and it is observed that different growth behaviors of oriented grains appear in different cooling conditions.

Conventionally, Σ3 grain boundaries are more desired than a non-coherent or non-Σ grain boundaries in a mc-Si structure due to the fact that Σ3 grain boundaries are more coherent and functions as a less efficient recombination center compared with the non-coherent counterpart (including incoherent and non-Σ grain boundaries). Alternatively stated, Σ3 grain boundaries are more "electrically inert" than the non-coherent boundaries. Using conventional means to grow mc-Si, the percentage of Σ3 grain boundaries is greater than the percentage of the non-coherent counterpart in order to retain sufficient quantum efficiency or conversion efficiency of a photovoltaic. However, the quantum efficiency of a mc-Si photovoltaic still hits a limit because the accumulation of the impurities and multiplication of dislocations not only occurs at the grain boundary region but also in the grain body. Taking this fact into consideration, the present disclosure provides a mc-Si structure having a greater percentage of non-coherent grain boundaries than that of the coherent grain boundaries, and showing better conversion efficiency than the mc-Si structure prepared according to conventional means.

In some embodiments of the present disclosure, the coherency of the grain boundary can be identified by at least two methods: (1) by a computer-programmed EBSD, and (2) by photoluminescence (PL) observing the incoherent/non-Σ grain boundaries.

In some embodiments, a structure of mc-Si, which can be a mc-Si ingot, a mc-Si brick, or a mc-Si wafer, is disclosed. The structure of mc-Si shows a greater percentage of non-coherent grain boundaries (for example, a summation of the incoherent grain boundaries and non-Σ grain boundary) than that of the coherent grain boundaries. In some embodiments, the mc-Si brick possesses a greater percentage of non-coherent grain boundary in a bottom portion than that in a top portion. In some embodiments, the mc-Si wafer possesses a percentage of non-s grain boundary from about 60 to about 75 and a percentage of Σ3 grain boundary from about 12 to about 25. In some embodiments, a percentage of the non-Σ grain boundary and a percentage of Σ3 grain boundary of a mc-Si wafer are substantially identical.

A method for obtaining the mc-Si structure described herein is also disclosed. A nucleation promotion layer is utilized to promote a small grain size at the initial of the mc-Si grain growth. As described in the following, the nucleation promotion layer can be made of silicon beads with an average dimension of about less than 10 mm. In some embodiments, the silicon beads can take spherical shape. In some embodiments, the silicon beads can be single crystalline silicon, multicrystalline silicon, silicon carbide, or combinations thereof.

In some embodiments of the present disclosure, when preparing a mc-Si ingot or brick, {100} and {110} polysilicon grains were favored at a high cooling rate, e.g., 30 K/min, as a result of kinetic control; the growth velocity of {100} was 140.8 cm/h at 30 K/min. On the contrary, at a low cooling rate, e.g., 1 K/min, {111} grains were dominant due to thermodynamic control that favors the orientation with the lowest interfacial energy. By using phase field modeling, similar developments can be obtained. The force balance is further used at the tri-junction to explain the dominance of {111} grains at the low growth rate. The critical velocity for facet formation, as a result of morphological instability, was estimated around 12 cm/h. However, the growth velocity for {100} dominated growth was unknown. Therefore, for the grain competition in a normal speed at about 1 cm/h in commercial mc-Si production, {111} grains should be dominant. Moreover, the grain competition in silicon is far more complicated than people having ordinary skill in the art have expected due to twin formation.

Referring to FIG. 1A, in some embodiments, mc-Si ingot (70 mm in broadest dimension) is grown by directional solidification in an apparatus 100. The directional solidification setup using induction coil 101 for heating is shown, where the crucible 102 is insulated by graphite felt 103 [to inventor: please verify whether 103 is an aluminum felt or a graphite felt] to better control the solidification front. Spherical silicon beads 104 (for example, 0.92 mm in diameter from CV 21, Japan) are used as the seed layer. In some embodiments, the nucleation promotion layer may possess a height H at a bottom of the crucible. In some embodiments, the height H is about 20 mm.

In some embodiments of the present disclosure, spherical silicon beads can be used as the nucleation promotion layer for directional solidification of mc-Si. However, silicon beads are not limited to a spherical shape. Any form of silicon scraps with a characteristic dimension of equal to or smaller than 10 mm is within the contemplated scope of the present disclosure. For example, a roughened crucible bottom can be used as the nucleation promotion layer. In some embodiments, the roughened crucible bottom can be formed by a blanket physical or chemical etch and thus the concave and convex patterns being randomly disposed, with a characteristic dimension (for example, a distance between a vertex of a convex and a bottom of a concave) being smaller than or equal to about 10 mm. In other embodiments, the roughened crucible bottom can be formed by a patterned etch. For example, line features or dot features with a pitch of smaller than or equal to about 10 mm can be formed as the nucleation promotion layer.

In the following description, the experimental setup and procedure are described briefly, followed by results, discussion, and conclusion. In some embodiments, the seeds used for directional solidification mc-Si growth are not limited to spherical beads, as discussed. Any beads having an average diameter of lower than 50 mm, preferably lower than 10 mm, are suitable for the subsequent mc-Si growth. In some embodiments, the silicon beads can be made of single crystalline silicon, multicrystalline silicon, or a mixture thereof. Other materials such as silicon carbide can also be used, separately or together, with silicon seeds. In the case of using single crystalline beads, although all the beads are having a single orientation, for example, {110}, the pole direction of each bead is not necessary perpendicular to a normal of the bottom of the mc-Si ingot or brick. Details of the single crystalline beads will be further discussed in FIG. 1B.

Figure 1B:
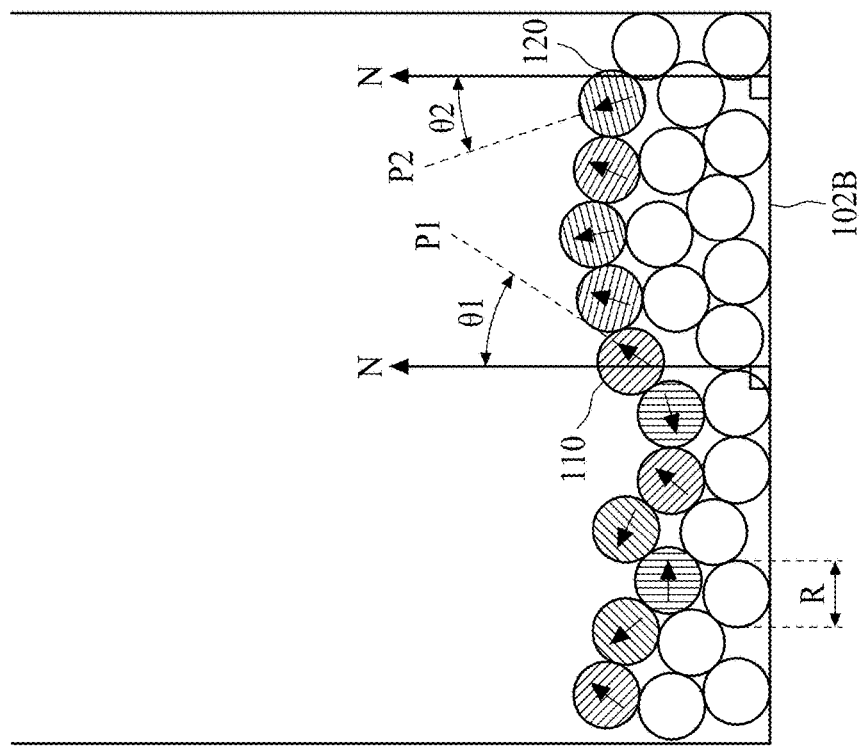
FIG. 1B is a schematic illustration of silicon beads in the nitride-coated quartz crucible, in accordance with some embodiments.

Referring to FIG. 1B, in some embodiments with single crystalline silicon beads, for example, {110} silicon beads, the pole direction P1 of a first bead 110 and a normal N of the crucible bottom 102B form an angle θ1 greater than zero. Similarly, the pole direction P2 of a randomly selected second bead 120 (other than the first bead 110) and a normal N of the crucible bottom 102B form an angle θ2 greater than zero. The angles θ1 and θ2 can be different. In other words, even if the beads 110 and 120 are made of single crystalline materials having an orientation of {110}, the ingot formed thereon can be multicrystalline with random crystal orientations due to the randomly disposed pole directions of the single crystalline beads. In other embodiments, the silicon beads can be multicrystalline silicon, silicon carbide, crystalline material beads other than silicon, or combinations thereof.

In some embodiments, before solidification started, silicon raw material was melted leaving about 5 mm to 10 mm of the nucleation promotion layer at the bottom. The temperature gradient of the furnace for crystal growth was about 10 K/cm. Therefore, the estimated cooling rate was about 3.33 K/min for the crucible speed of 20 cm/h. However, in a commercial mc-Si production, the temperature gradient of the furnace is about 1K/cm and the crucible speed being around 1 cm/h. Hence the estimated cooling rate is about 0.0167 K/min in a production setting.

Figure 2A:
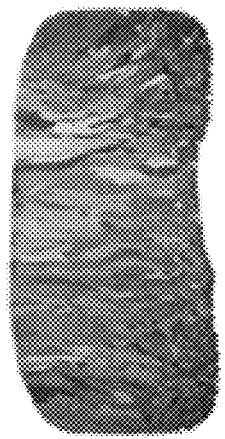
FIG. 2A is a longitudinal cross section of ingots at a pulling speed of 10 mm/h, and the dashed line indicates the initial melt/solid interface, in accordance with some embodiments.
Figure 2B:
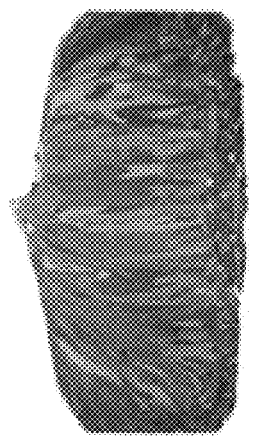
FIG. 2B is a longitudinal cross section of ingots at a pulling speed of 50 mm/h, and the dashed line indicates the initial melt/solid interface, in accordance with some embodiments.
Figure 2C:
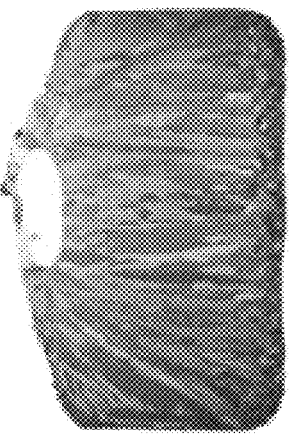
FIG. 2C is a longitudinal cross section of ingots at a pulling speed of 200 mm/h, and the dashed line indicates the initial melt/solid interface, in accordance with some embodiments.

Referring to FIG. 2A to FIG. 2C, three ingots are grown from different crucible pulling speeds. The ingots are labeled as V1 for the crucible speed at 10 mm/h, V5 for 50 mm/h, and V20 for 200 mm/h. After crystal growth, the ingots were cut into wafers and polished for further analysis. The wafers were also chemically etched (HNO3:HF=6:1) for subsequent characterizations. The grain orientation and boundary mappings were carried out by using electron backscattered diffraction (EBSD) (Horiba Nordlys F+) with a step size of 10 µm, which was installed in an SEM (Hitachi S3400).

The longitudinal cross sections of the grown ingots are shown in FIG. 2A to FIG. 2C for comparison. As shown, the columnar grains were grown upward nicely from the nucleation promotion layer in all cases. The interface shape was nearly flat except near the crucible wall. This could also be seen from the grain growth direction. Near the crucible wall (not shown), new grains appeared and grew inwards. As the pulling speed increased, the interface became more concave. Again, this could be seen from the convergent grains toward the center near the upper parts of FIG. 2B and FIG. 2C. After crystal growth, the unmelted silicon beads sintered together, but the initial solidification front could be determined from the starting points of the columnar grains.

Figure 3A:
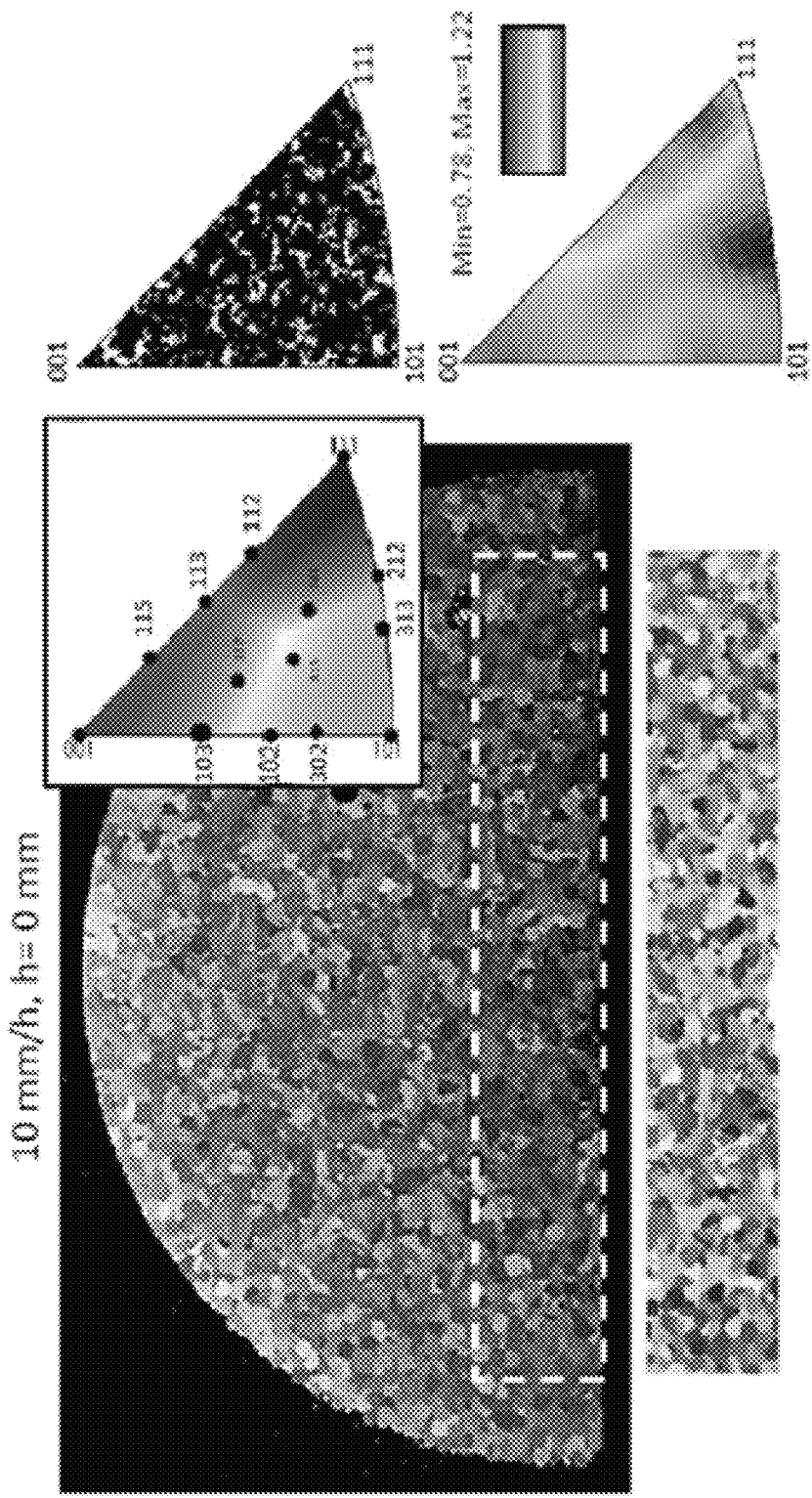
FIG. 3A is a grain structure (left), EBSD mapping (bottom), and the inverse pole diagrams (right) at an ingot height 0 mm of ingot V, in accordance with some embodiments.
Figure 3B:
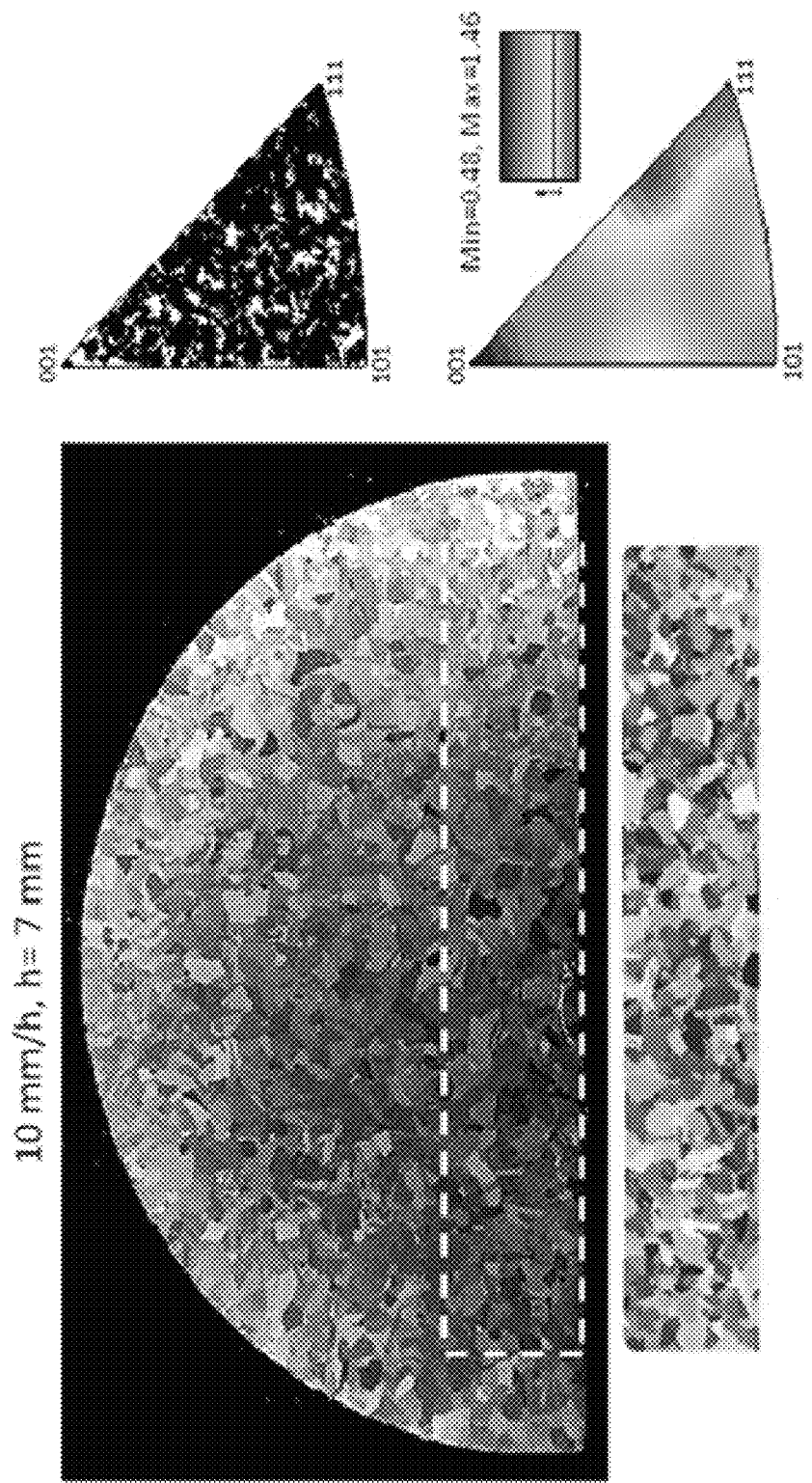
FIG. 3B is a grain structure (left), EBSD mapping (bottom), and the inverse pole diagrams (right) at an ingot height 7 mm of ingot V, in accordance with some embodiments.
Figure 3C:
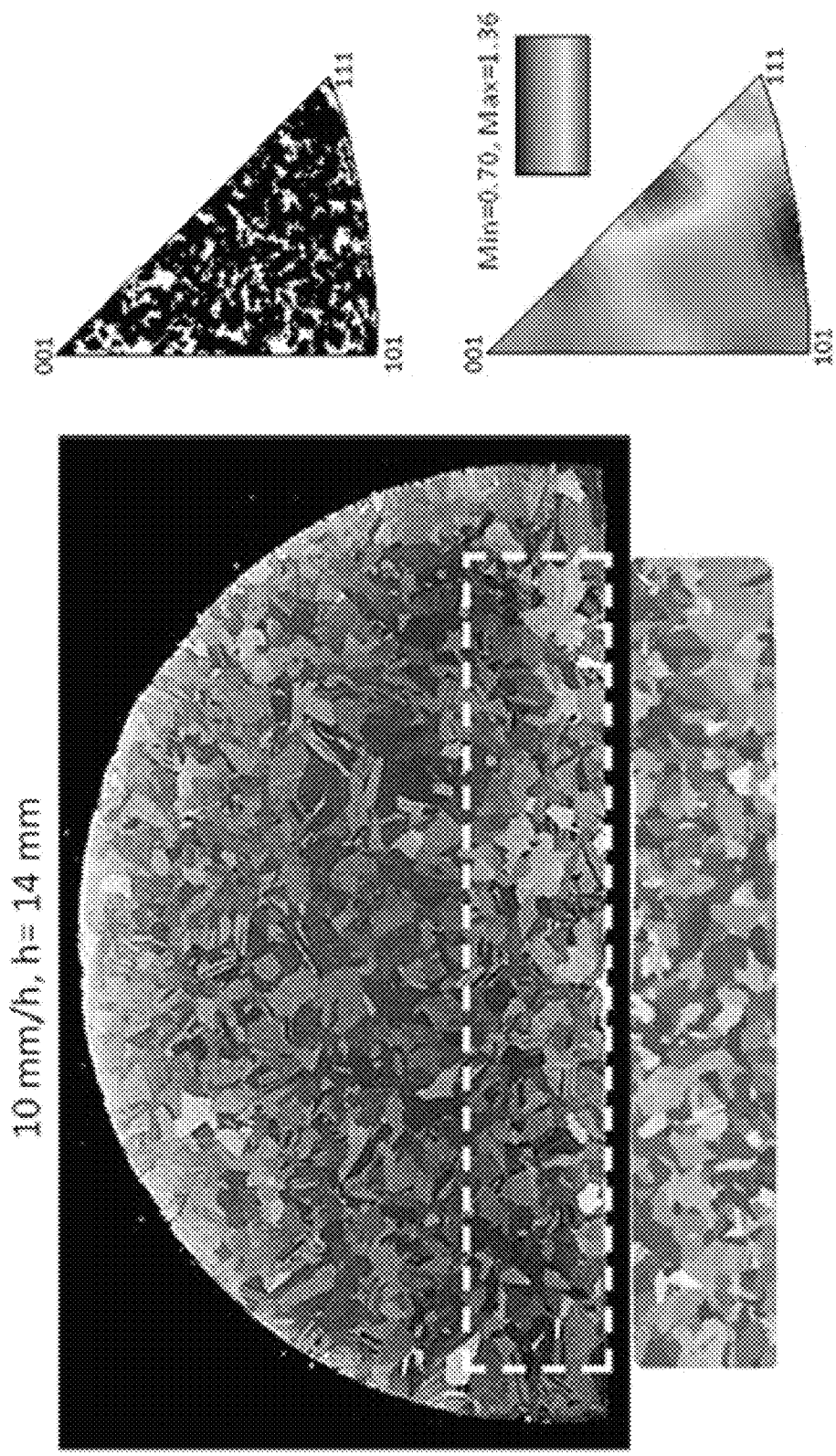
FIG. 3C is a grain structure (left), EBSD mapping (bottom), and the inverse pole diagrams (right) at an ingot height 14 mm of ingot V, in accordance with some embodiments.

The width of the columnar grains grew upward slowly, but the grain size needed to be analyzed from the cross section grains, which will be discussed shortly. In some embodiments, the columnar grains can have an average height of about 3 cm. However, in a commercial production setting, the columnar grains can have an average height of from about 25 cm to about 36 cm due to different ingot growth conditions. An interesting observation was that some grains were terminated suddenly by other grains due to their tilted growth orientation from the observed cutting plane. Moreover, some disoriented grains grew in the direction that was quite different from the growth direction. This could be explained by the twin formation from the {111} facets, which will be discussed shortly. Otherwise, the oriented grains will grow over the disoriented grains during grain competition The horizontal cuts of ingot V1 and their EBSD results are shown in FIG. 3A-FIG. 3C, respectively, for the positions at ingot or brick height h=0 mm, 7 mm, and 14 mm from the starting point of the columnar grains. Although the area near the wafer center (50% of the diameter), where the grains grew vertically, should be the better area for orientation analysis, its difference from the bigger area mapping (80% of the diameter) was found not significant change. To have more grains for analysis, the present disclosure still chose the bigger area for orientation comparison. In each figure, the grains in the dashed box are analyzed. Their orientation mapping is shown at the bottom of the figure; the corresponding color to the orientation is indicated at the top right corner of the photograph in FIG. 3A. In addition, the inverse pole diagrams, in terms of the frequency counts and their contours, are shown on the right. As shown in FIG. 3A, the grains are uniform and round due to the uniform silicon beads are used as the nucleation promotion layer. The orientations were quite random as well, although the contours showed some difference, but the difference of the contour minimum (0.78) shown in blue and maximum (1.22) shown in red is not large. Also, the horizontal cut did not follow exactly the initial solidification front. However, as the position increased to h=7 mm, as shown in FIG. 3B, the grain size increased. More importantly, the percentage of the orientations near {112} and {111} increased substantially. This trend continued to the top of the ingot, where the orientations near {112} being dominant, as shown in FIG. 3C.

The reason for the dominance of {112} grains may related to the factors that this orientation has the lowest interfacial energy next to {111}, and the angle between {111} and {112} is only 19.471. Some commercial wafers grown by using an incubation layer also have more {112} grains till the top of the ingot. In other words, the grain competition remained similar regardless the ingot height; the percentage of {112} at h=14 mm for V1 was about 15%. Furthermore, in the development of grain structures in a small notch, {112} grains became dominant form the initial {110} grains in a small growth distance of 4 mm. Therefore, in some embodiments, {112} are the dominance orientation of the grain competition from random seeds.

Figure 4:
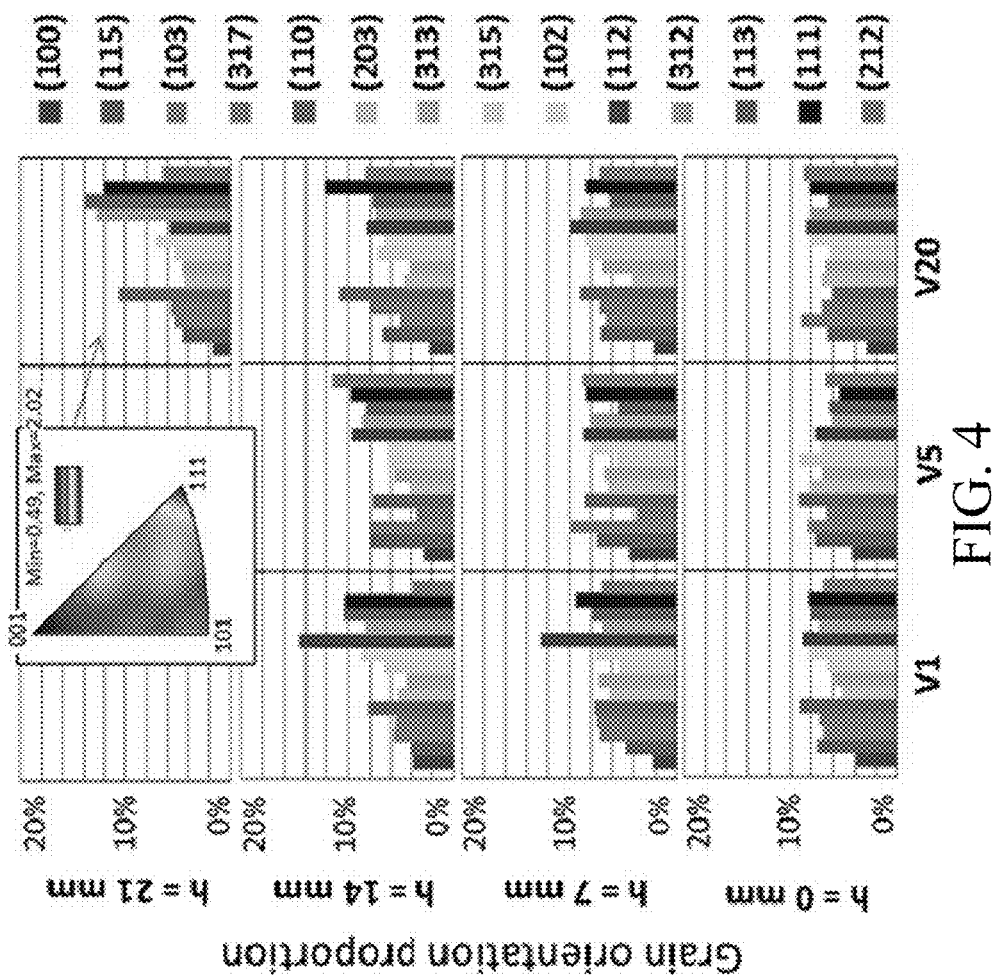
FIG. 4 is a comparison of major grain orientations at different growth distances for different pulling speeds; the inverse pole diagram of the orientation of V20 at h=19 mm is included for comparison, in accordance with some embodiments.

The development of grain structures of ingots V5 and V20 was similar to ingot V1. However, {111} became more dominant at the end of the growth. The percentage evolutions of major grain orientations of the three ingots were compared in FIG. 4. As shown, {112} grains became dominant for ingot V1, while {111} grains became dominant for ingots V5 and V20. In fact, {212} grains in V5 were slightly more than {111} grains, but the smallest orientation difference between them is only 15.81, and this could be caused by the deflection of the interface. Again, the dominance of {111} grains was consistent with previous observations. The {110} grains in V1 and V20 were also more than other grains. Because the {110} orientation is rather rough, the growth rate in this orientation could be high at high undercooling. Nevertheless, the distribution of the grain orientations in all cases was rather wide, but {100} grains remained few near the end. As will be discussed shortly, the angle between {100} and {111} is large being about 54.71, which is easier to generate a higher undercooling for twin formation.

The average grain sizes are also calculated. For simplicity, the grain size is calculated by dividing the diagonal distance of the dashed box by the grain numbers across the distance. The grain size increased with the growth distance for all velocities; it increased from 0.92 mm at the bottom to about 1.2, 1.4 and 1.6 mm at the height of 19 mm for ingots V1, V2, and V3, respectively. In some embodiments, it is found that the grain growth became more significant with the increasing crucible pulling velocity.

Figure 5:
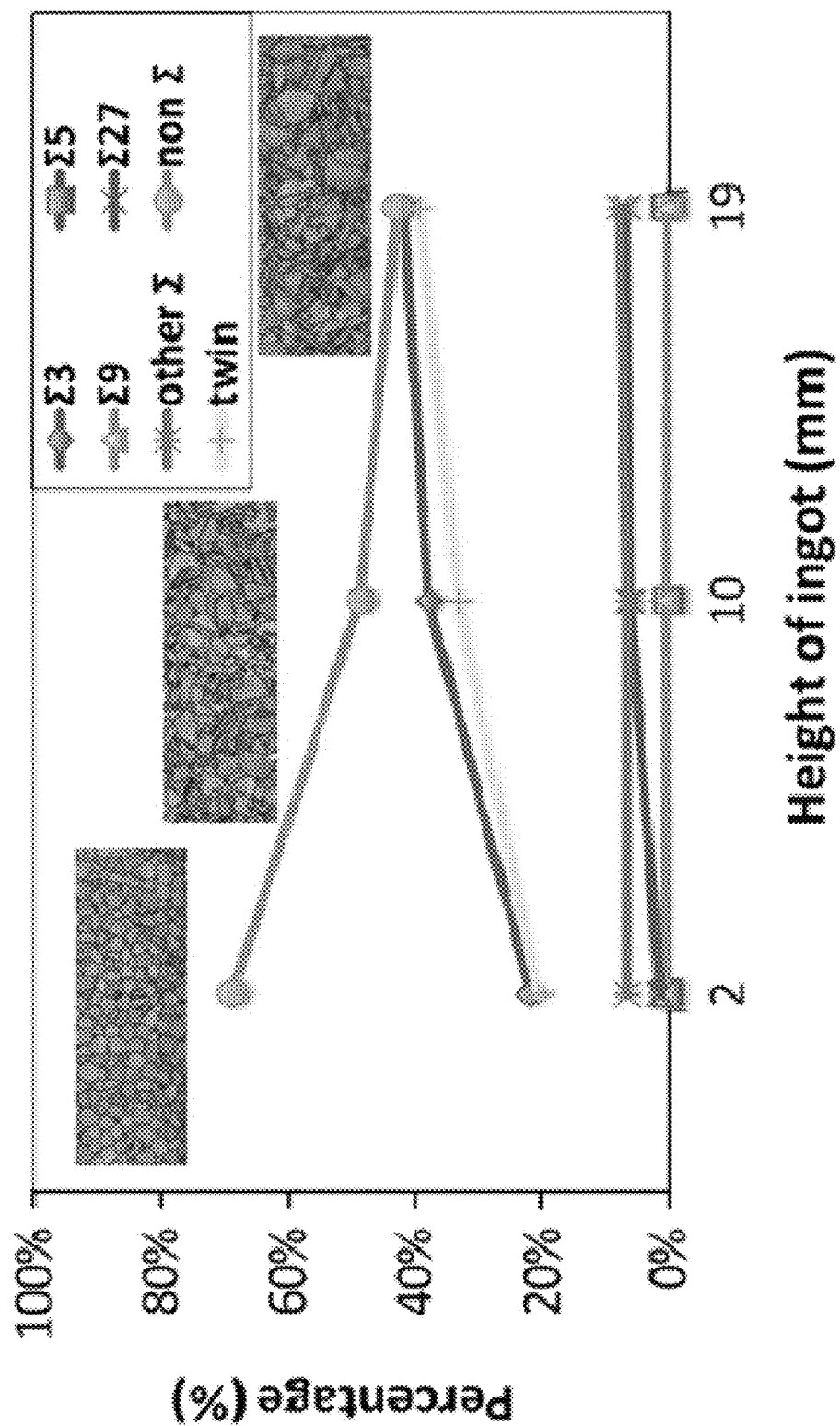
FIG. 5 shows the development of major grain boundaries along the growth direction for ingot V1. The twin boundaries (purple) and typical grain boundary mappings at the given heights are inserted for comparison; the results for ingots V5 and V20 are similar. (For interpretation of the references to color in this figure caption, the reader is referred to the web version of this paper.), in accordance with some embodiments.

The development of grain boundaries was further examined, and the result for ingot V1 is shown in FIG. 5. The mappings of grain and twin boundaries at different positions are inserted in the figures for comparison; the twin boundaries are indicated by the purple lines. As shown, the percentage of non-Σ grain boundaries was quit high being about 60-70% at the beginning, but decreased slowly to about 45% near the end of the growth. In some embodiments, the percentage of non-Σ grain boundaries is at about 70% at the beginning of the growth or at the bottom of the ingot, and such percentage drops to about 40% within a subsequent 20 mm growth height.

Still referring to FIG. 5, the percentage of Σ3 grain boundaries was only about 20-25% at the beginning, but their percentage increased with height. Near the top of the ingot, the percentage was about 40-45%. The percentage of non-E grain boundaries was about 65-75% at the beginning, but their percentage decreases with height. Near the top of the ingot, the percentage was about 40-45%, similar to that of the Σ3 grain boundaries. In some embodiments, a percentage of non-Σ grain boundary and a percentage of Σ3 grain boundary of a multicrystalline silicon (mc-Si) wafer are substantially identical. Further in some embodiments, the percentage of non-Σ grain boundary and the percentage of Σ3 grain boundary are in a range of from about 40 to about 50. In some embodiments, the aforesaid mc-Si wafer can be separated from a top portion of an ingot or a brick. In some embodiments, the twin boundaries and Σ3 boundaries in a mc-Si wafer are almost the same based on the computer software of EBSD. In some embodiments, a preferred grain orientation of a mc-Si wafer is observed to include {112}.

Apparently, the high percentage of the non-Σ or incoherent boundaries was due to the initial nucleation from the silicon beads, which had random orientations. Some twins existed already in the silicon beads due to their formation process. As crystal growth continued, grain boundaries with a higher symmetry and a lower interfacial energy, such as the coherent Σ3 and twin grain boundaries, are preferred. Ingots V5 and V20 had very similar grain boundary evolution as ingot V1, as shown in FIG. 5. However, the coherent Σ3 grain boundaries increased faster as the pulling speed increased, and for ingot V3 (not shown in FIG. 5), the coherent Σ3 grain boundaries increase to more than 40% within 10 mm of growth height. Again, this could be due to the increase of undercooling in the groove of grain boundaries for twin nucleation.

However, in other embodiments where the scale of the crucible and the temperature gradient are inclined to fit an industrialized production setting, a percentage of the non-coherent grain boundary in a bottom portion of a mc-Si brick or ingot is greater than a percentage of the non-coherent grain boundary in a top portion of a mc-Si brick or ingot. In some embodiments, the non-coherent grain boundary includes non-Σ grain boundaries as previously discussed. Moreover, as shown in FIG. 5, the non-coherent grain boundary herein may include Σ5, Σ9, Σ27, other Σ, and non Σ grain boundaries. On the other hand, a percentage of coherent grain boundary in the bottom portion of a mc-Si brick or ingot is lower than a percentage of the coherent grain boundary in a top portion of a mc-Si brick or ingot. In some embodiments, the coherent grain boundary includes Σ3 grain boundary. As shown in FIG. 5, the coherent grain boundary herein may include both Σ3 and twin grain boundaries.

Figure 6A:
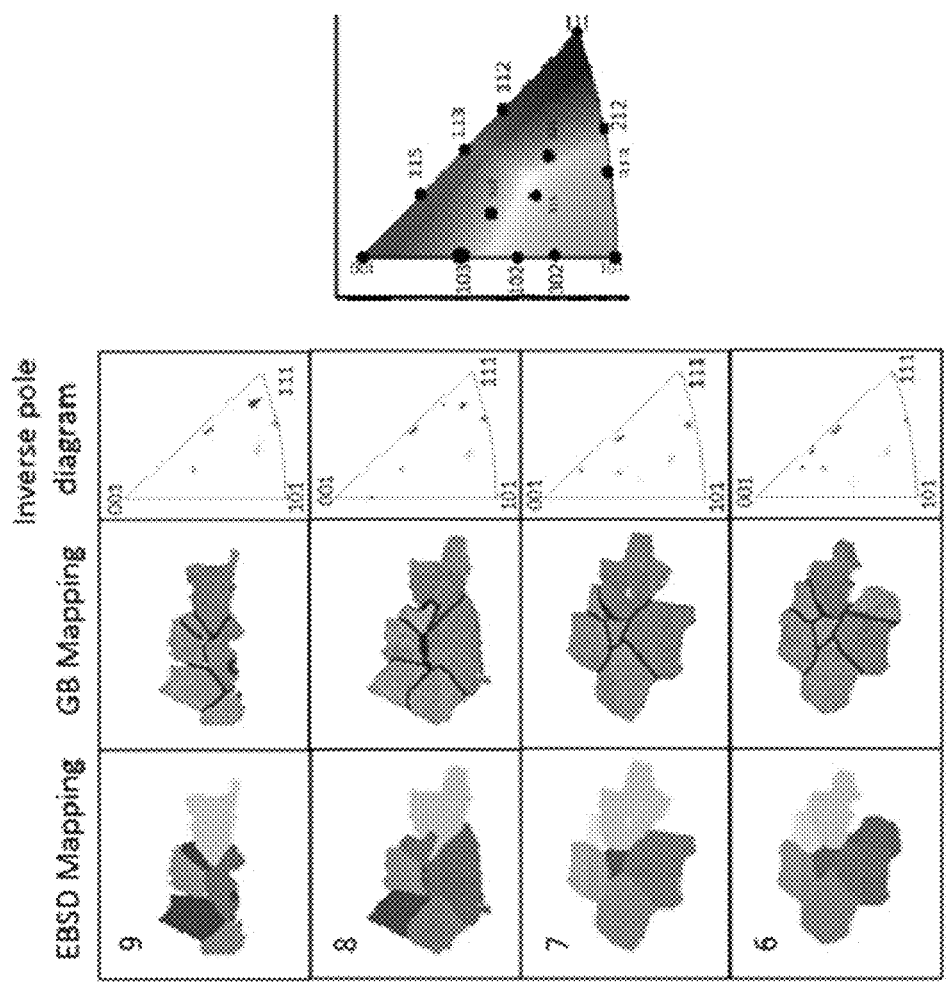
FIG. 6A shows a grain competition mechanisms (ingot V1, overgrown), in each figure, from the left to the right are EBSD, grain boundary mappings, and the inverse pole diagrams from different ingot positions. The number on the EBSD mapping indicates the wafer number, which was closed to its height in mm, in accordance with some embodiments.
Figure 6B:
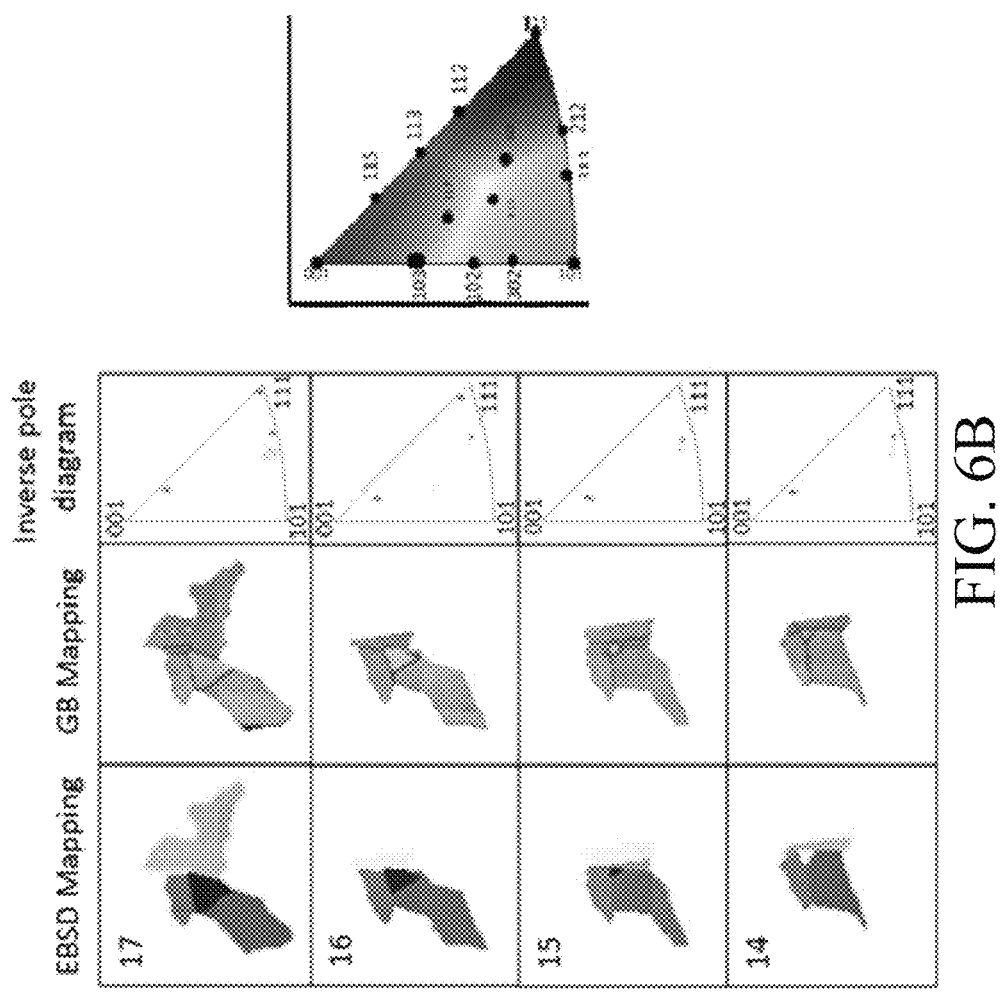
FIG. 6B shows grain competition mechanisms (ingot V1, a low-interfacial-energy grain formation at the tri junction), in each figure, from the left to the right are EBSD, grain boundary mappings, and the inverse pole diagrams from different ingot positions. The number on the EBSD mapping indicates the wafer number, which was closed to its height in mm, in accordance with some embodiments.
Figure 7A:
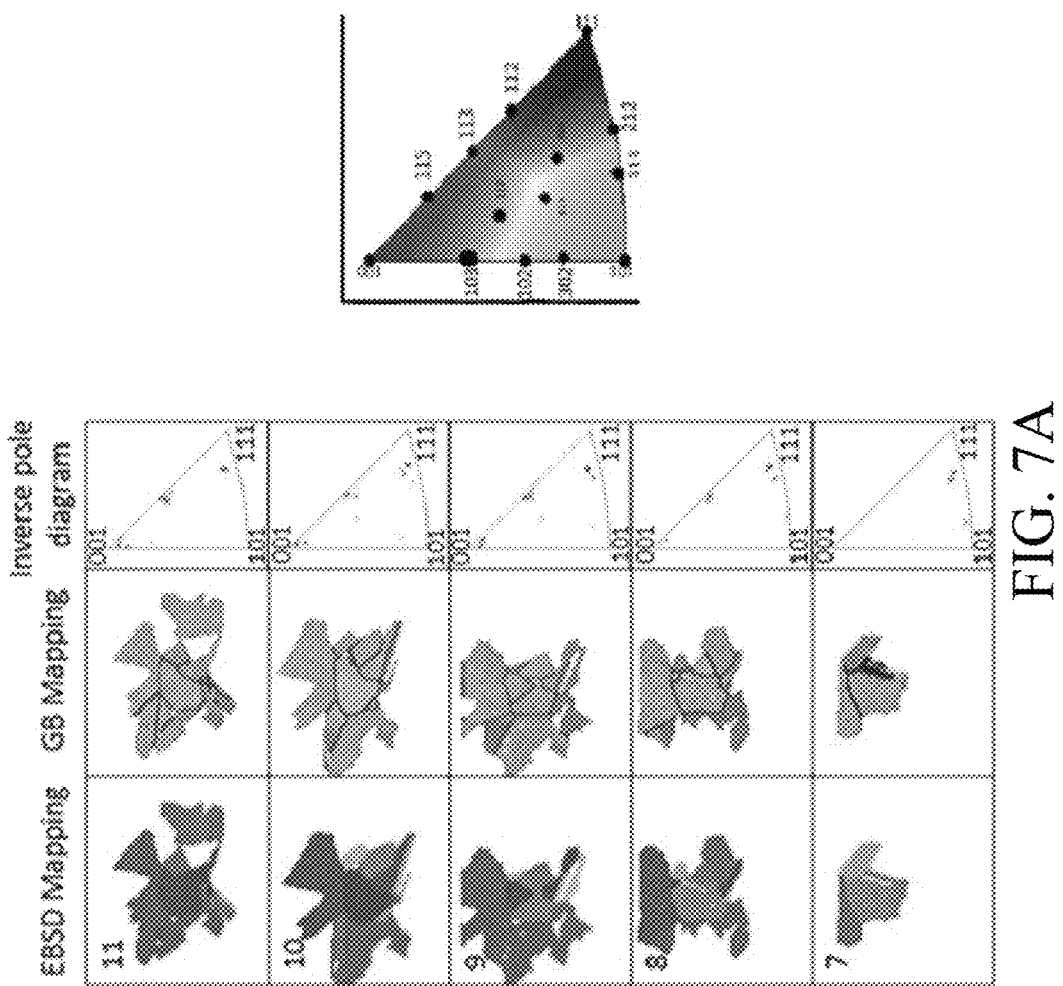
FIG. 7A shows grain competition mechanisms (ingot V1, high-interfacial-energy grain from the tri junction with twin boundary movement), in each figure, from the left to the right are EBSD, grain boundary mappings, and the inverse pole diagrams from different ingot positions. The number on the EBSD mapping indicates the wafer number, which was closed to its height in mm, in accordance with some embodiments.
Figure 7B:
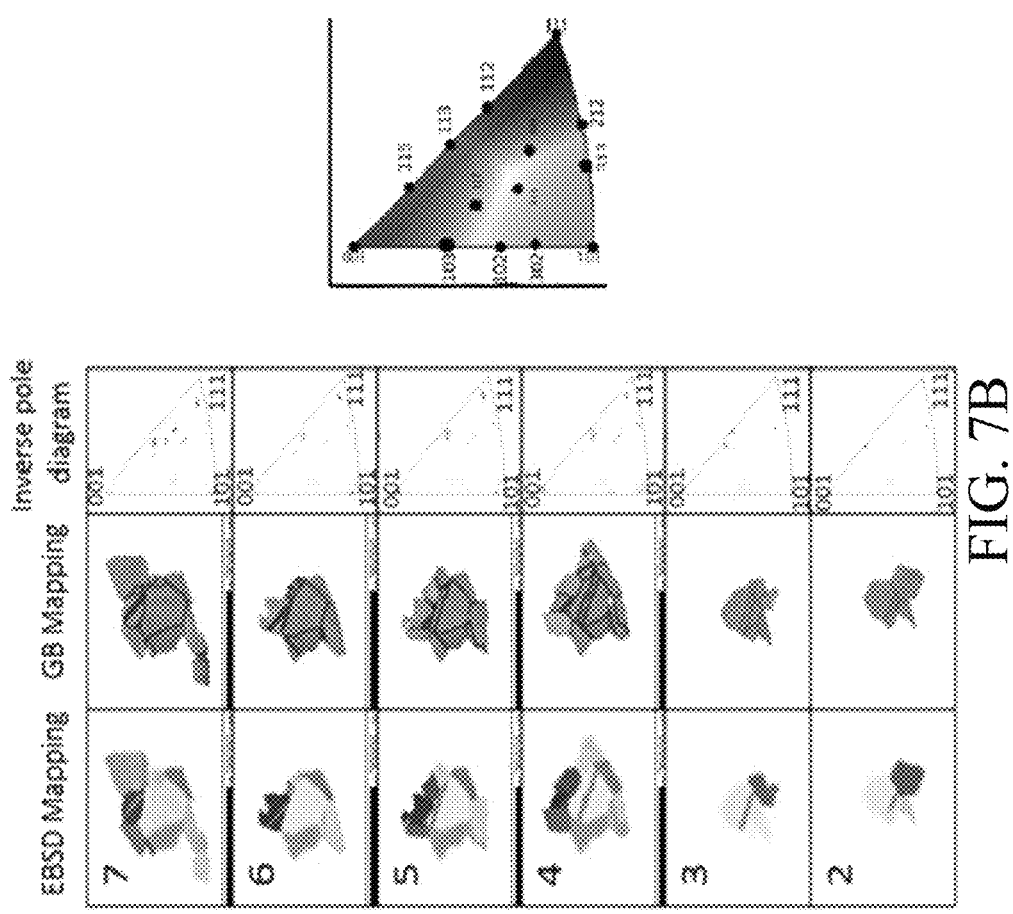
FIG. 7B shows grain competition mechanisms (ingot V1, twins movement), in each figure, from the left to the right are EBSD, grain boundary mappings, and the inverse pole diagrams from different ingot positions. The number on the EBSD mapping indicates the wafer number, which was closed to its height in mm, in accordance with some embodiments.

Grain competition and the development of twin boundaries from the wafers of ingot V1 is shown in the following description. Four cases are observed as shown in FIG. 6A, FIG. 6B, FIG. 7A, and FIG. 7B. The first case is illustrated in FIG. 6A for the grain bounded by non-coherent boundaries, and an orientation mapping is shown at the right of the figure. The grain with a higher interfacial energy, i.e., {115}, is overgrown by others having a lower interfacial energy as shown by the sequence 6, 7, 8, 9 of the EBSD mapping and grain boundary (GB) mapping. In the second case, as shown in FIG. 6B, new grains having a lower interfacial energy could nucleate from the tri junction. A {111} grain appeared at the tri junction, accompanied by the formation of a twin boundary shown by the sequence 14, 15, 16, 17 of the EBSD mapping and grain boundary (GB) mapping. The third case is illustrated in FIG. 7A for the nucleation of a high-interfacial-energy grain {100} from a tri junction. The {221} grain was overgrown, shown by the sequence 7, 8, 9, 10, 11 of the EBSD mapping and grain boundary (GB) mapping. The last case in FIG. 7B is the formation of grains between two twin boundaries that appeared and disappeared with the movement of twin boundaries shown by the sequence 2, 3, 4, 5, 6, 7 of the EBSD mapping and grain boundary (GB) mapping. The formation of multiple twins was consistent with the in situ observation using X-ray topography.

Apparently, the first two cases in FIG. 6A and FIG. 6B led to the dominance of low-interfacial-energy grains, such as {111}, during grain competition, as well as the formation of twin boundaries. However, in the last two cases in FIG. 7A and FIG. 7B, in addition to the formation of twin boundaries, the high-interfacial-energy grains, such as {100}, could also be generated. According to calculation, {100} could be generated from the twining of {221}. Moreover, although the twining process could generate high-interfacial-energy grains, the twining process could continue. Because {100} grains have more tilted {111} facets, 54.71, the undercooling could be higher and the twin formation could be easier. As a result, near the end of the growth, the percentage of {100} grains was very low. For ingots V5 and V20, the mechanisms of the development of grain structures were found similar to that of ingot V1, as shown in FIG. 6A to FIG. 7B. Again, the increase of twin and non-coherent grain boundaries is consistent with the twin formation mechanism at the facets. The wide distribution of the grain orientation might also be explained by the same mechanism as well.

The preferred growth orientation of mc-Si in directional solidification by using small silicon beads as the nucleation promotion layer with random orientations can be observed. It is found that {112}/{111} became dominant quickly in a short distance at the low crucible pulling speed of 1 cm/h. As the pulling speed increased, grains with an orientation near {111} became dominant, but the distribution was still wide. On the other hand, the percentage of {100} grains is low in all cases. Due to the random nucleation promotion layer orientations, the initial percentage of non-coherent grain boundaries was high being about 70%. As the crystal growth proceeded, more twin boundaries appeared, and their growth rate increased slightly with the increasing pulling speed. These observations were explained by the minimization of interfacial energy, as well as the twin nucleation/growth from {111} facets.

Figure 8:
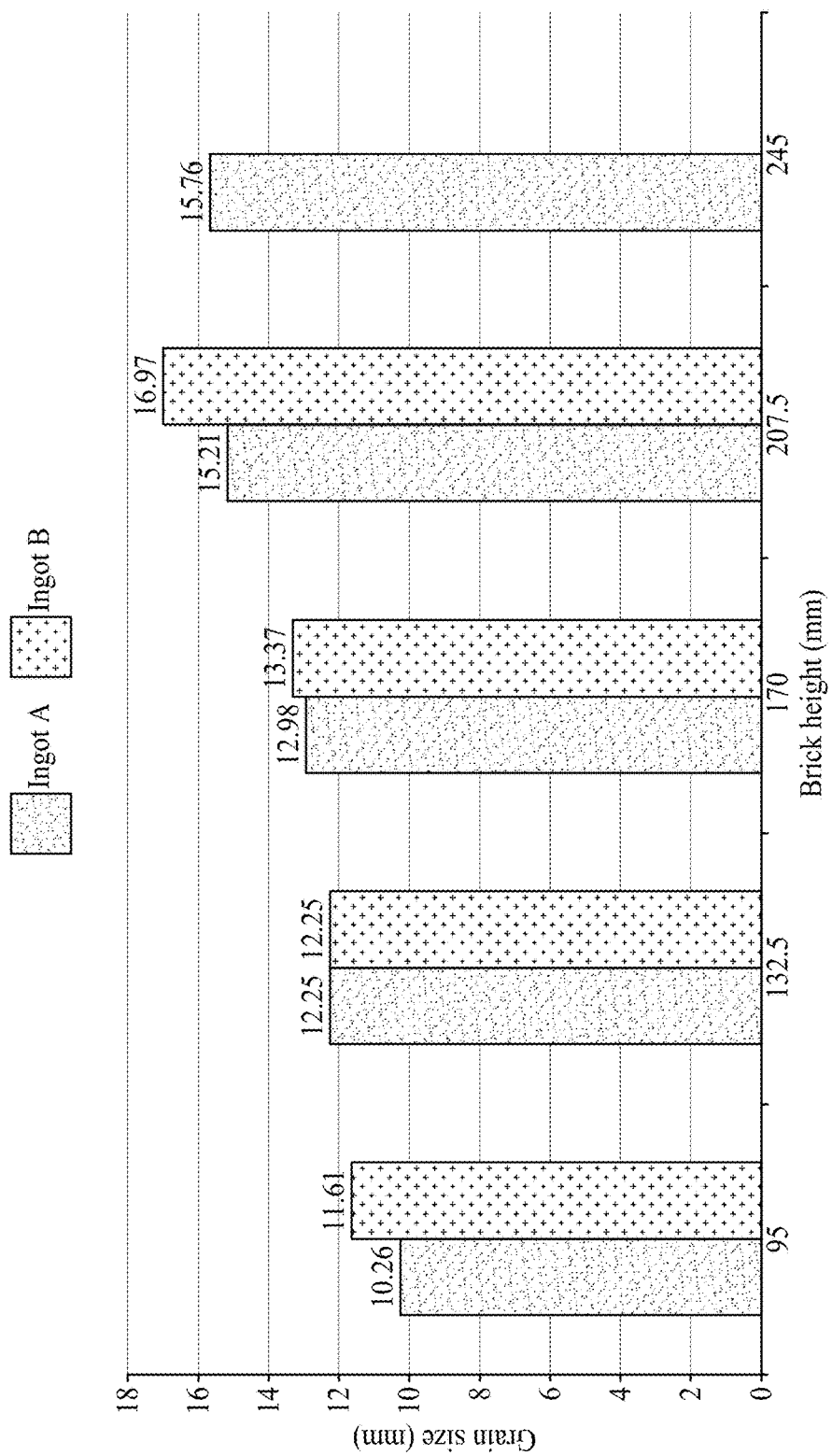
FIG. 8 shows the grain size at different heights of Ingot A and Ingot B, in accordance with some embodiments.
Figure 9A:
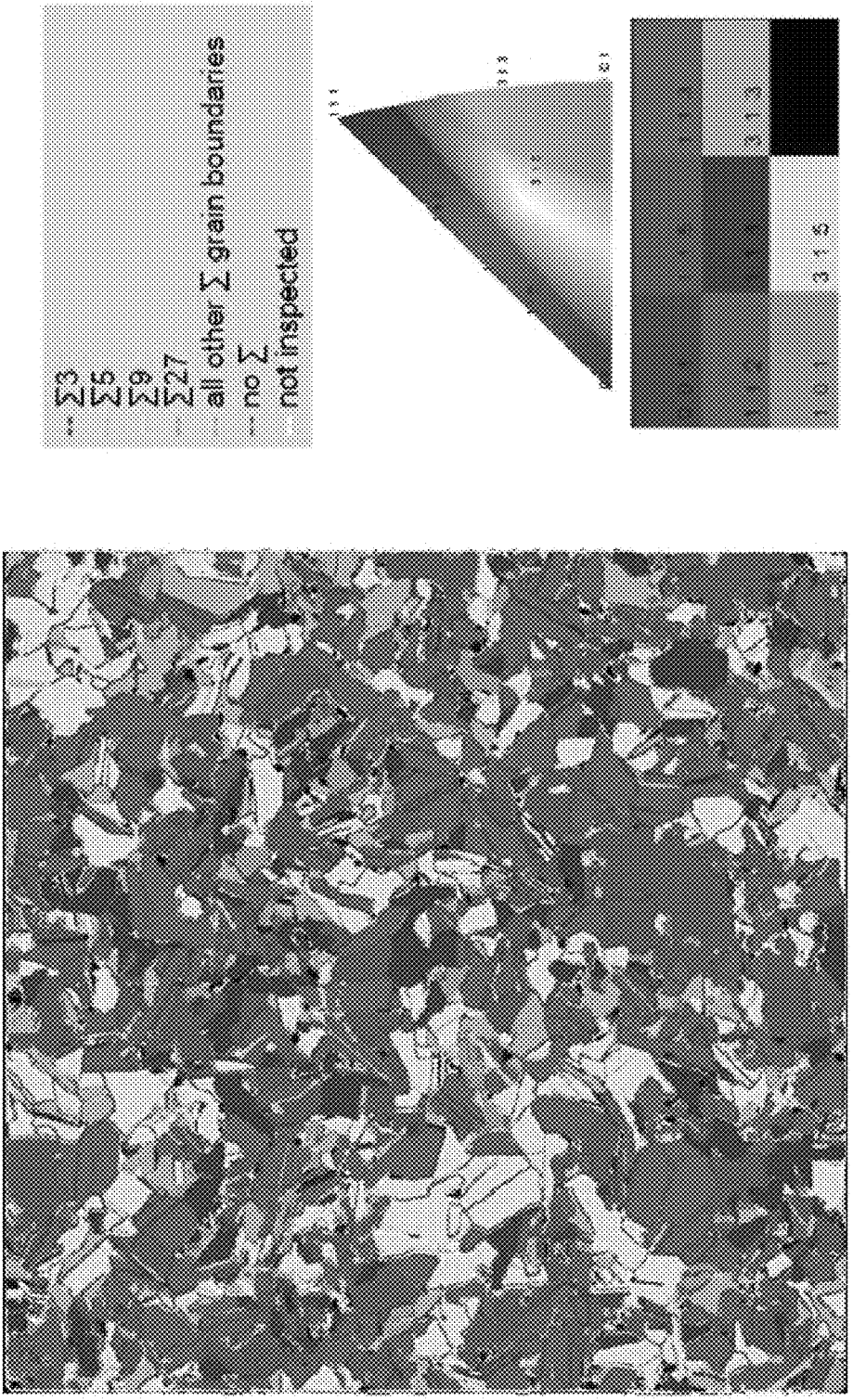
FIG. 9A shows grain orientation mappings and typical grain boundary mappings at a given height (95 mm) of Ingot B, in accordance with some embodiments.
Figure 9B:
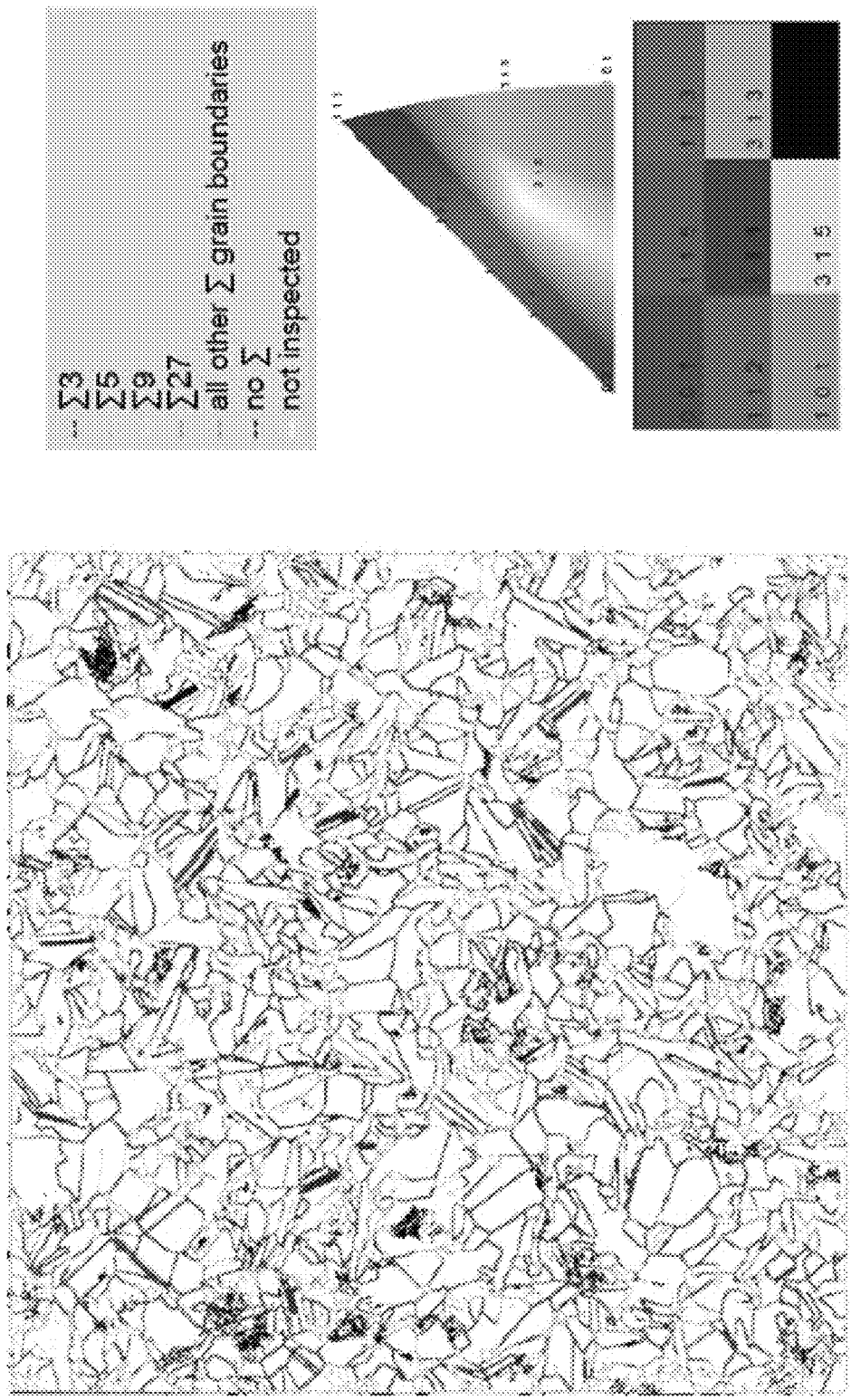
FIG. 9B shows defect location mapping and typical grain boundary mappings at a given height (95 mm) of Ingot B, in accordance with some embodiments.
Figure 10A:
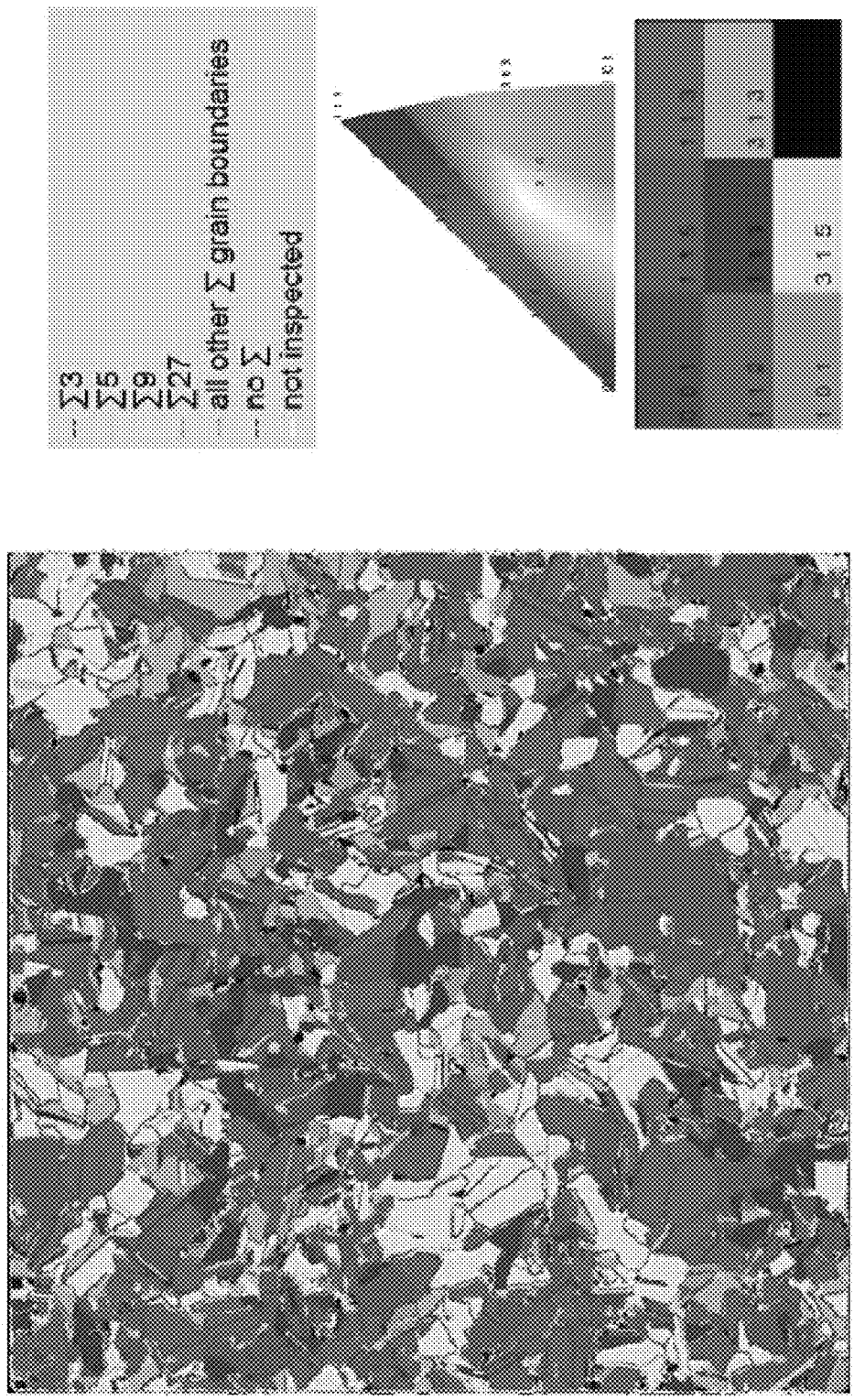
FIG. 10A shows grain orientation mappings and typical grain boundary mappings at a given height (132.5 mm) of Ingot B, in accordance with some embodiments.
Figure 10B:
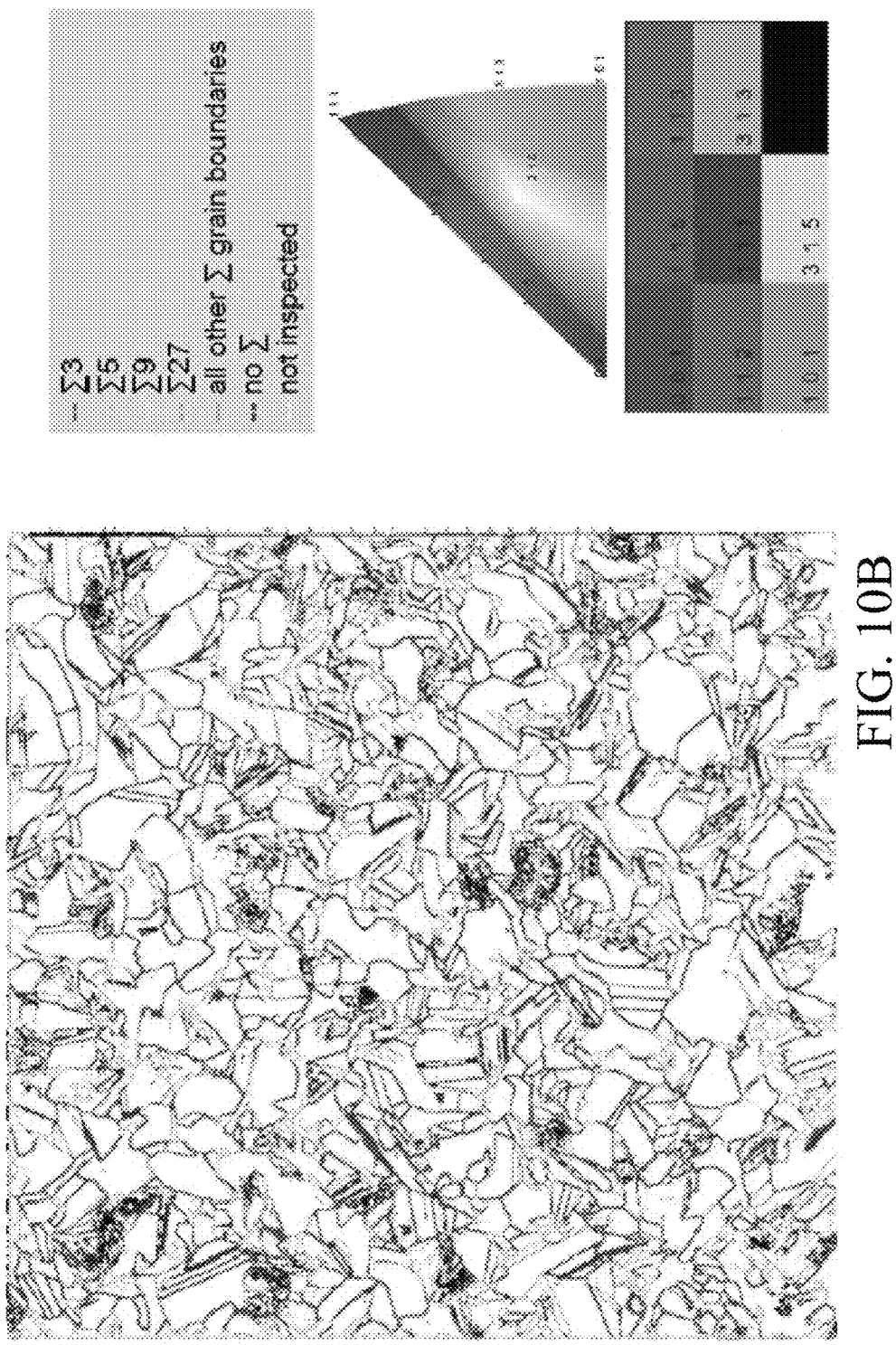
FIG. 10B shows defect location mapping and typical grain boundary mappings at a given height (132.5 mm) of Ingot B, in accordance with some embodiments.
Figure 11A:
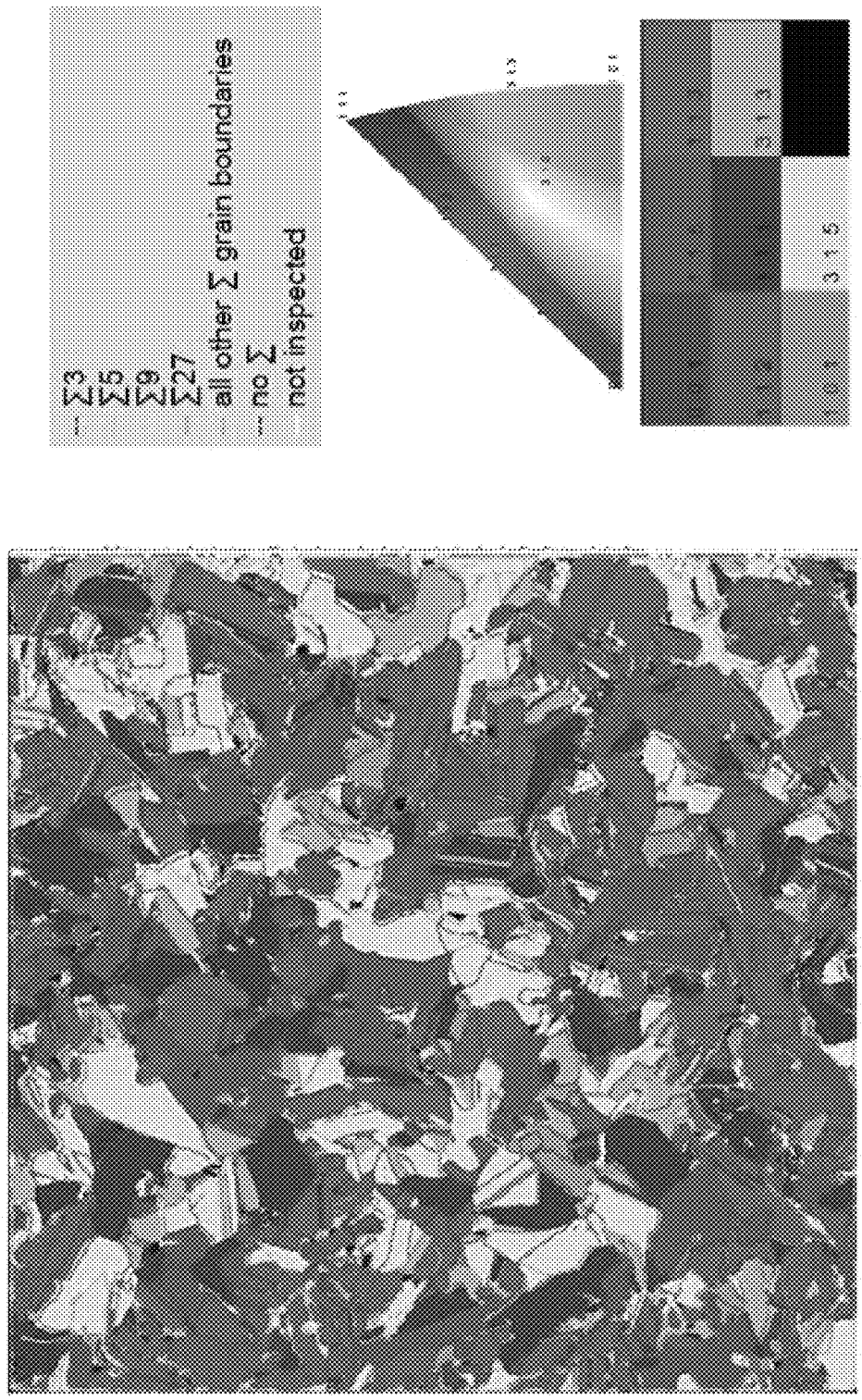
FIG. 11A shows grain orientation mappings and typical grain boundary mappings at a given height (170 mm) of Ingot B, in accordance with some embodiments.
Figure 11B:
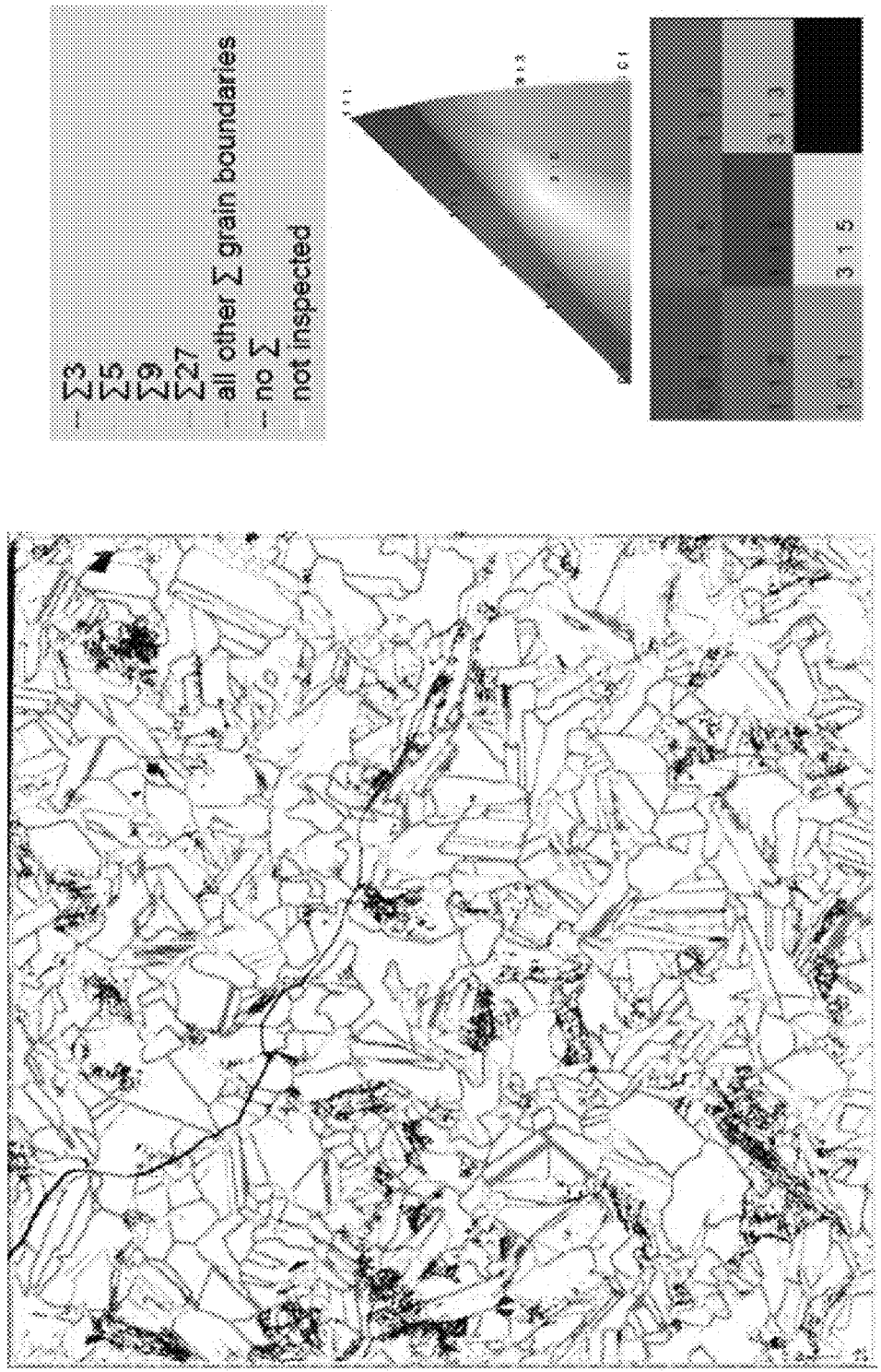
FIG. 11B shows defect location mapping and typical grain boundary mappings at a given height (170 mm) of Ingot B, in accordance with some embodiments.
Figure 12A:
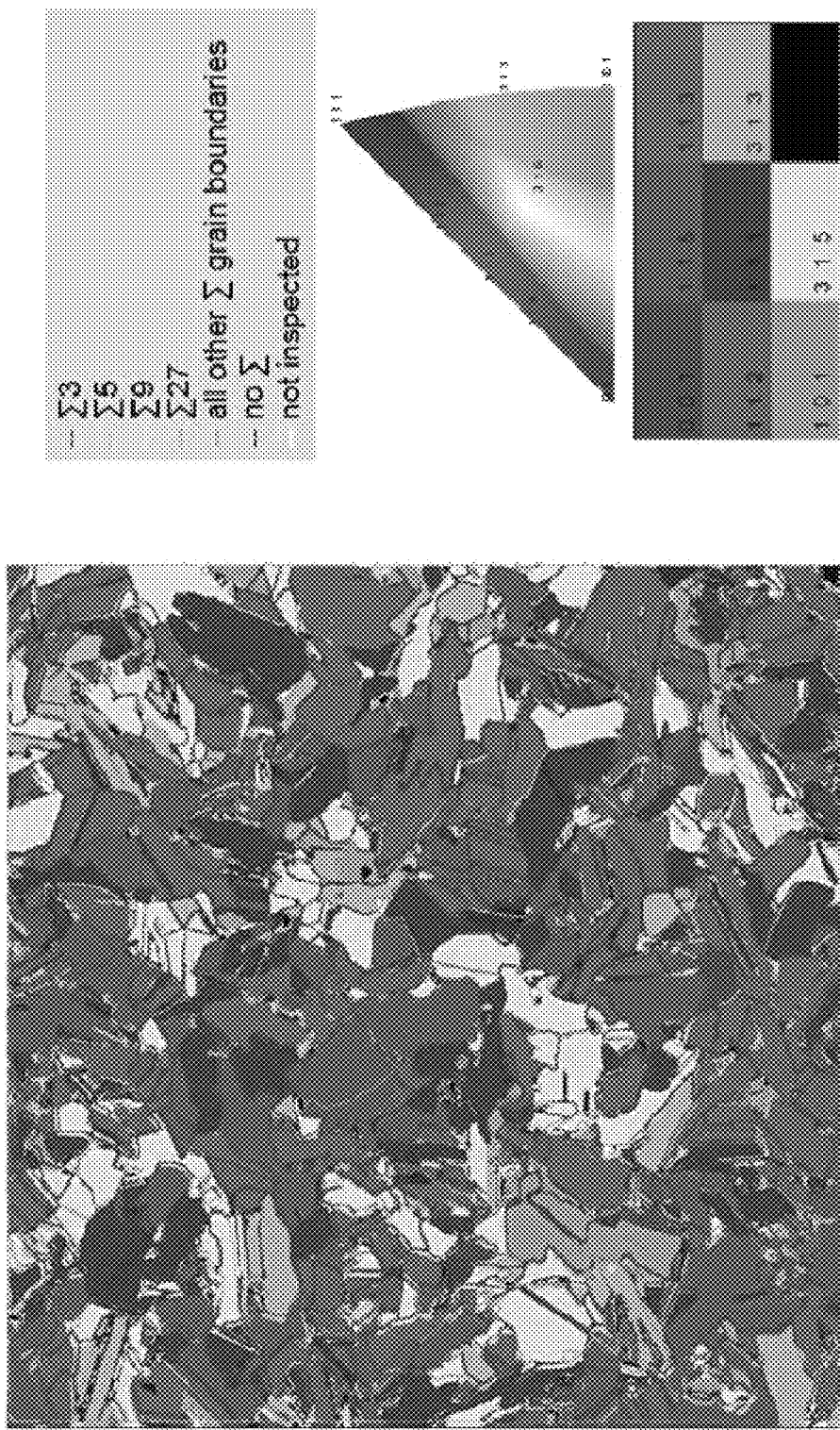
FIG. 12A shows grain orientation mappings and typical grain boundary mappings at a given height (207.5 mm) of Ingot B, in accordance with some embodiments.
Figure 12B:
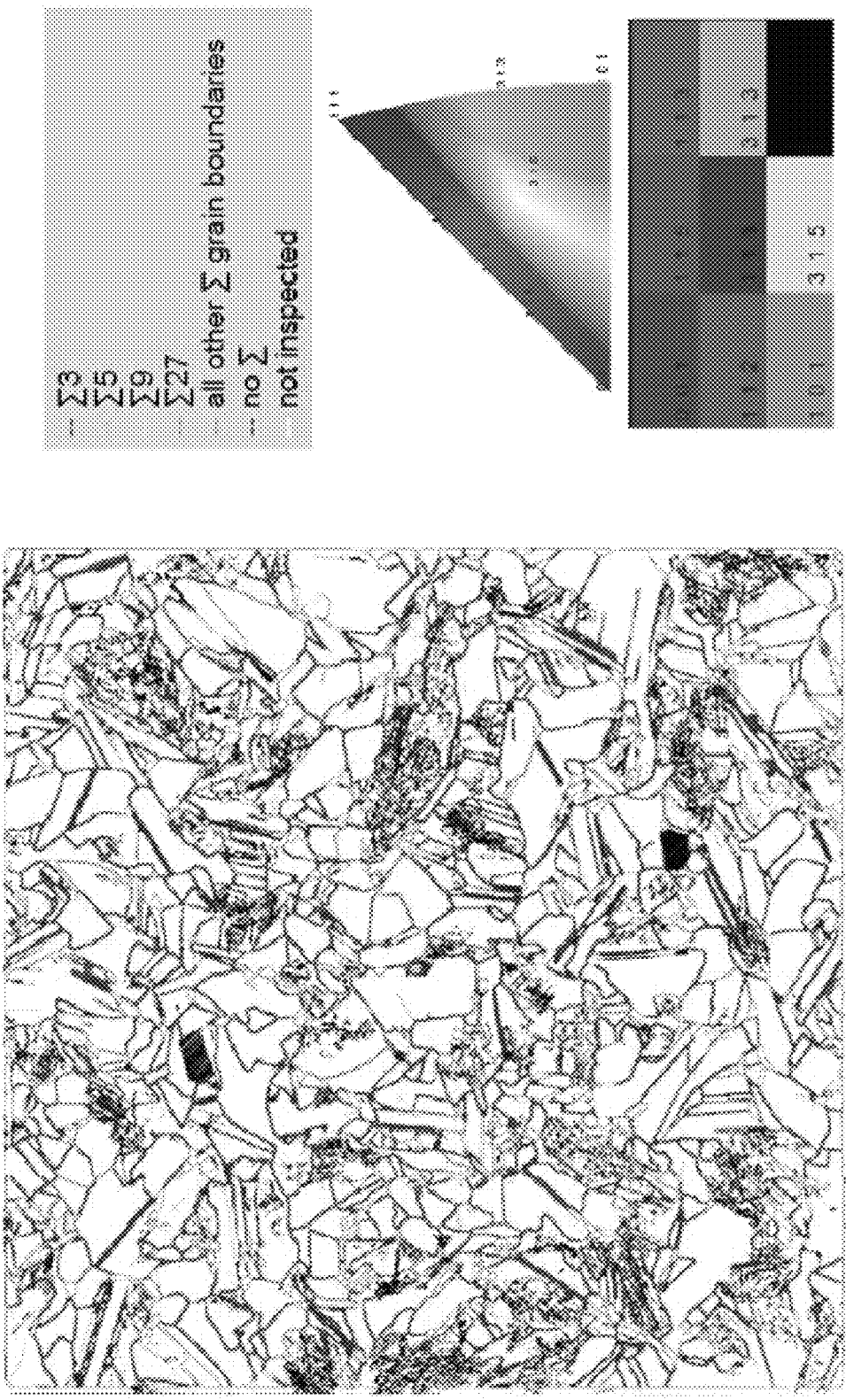
FIG. 12B shows defect location mapping and typical grain boundary mappings at a given height (207.5 mm) of Ingot B, in accordance with some embodiments.

Referring to FIG. 8 and Table 1, two ingots (ingot A and ingot B) are prepared according to the method disclosed herein. Table 1 records the grain sizes measured at different heights and FIG. 8 demonstrates the measurement result from a brick separated from ingot A and ingot B, respectively. A grain size distribution at different brick heights is shown. In both ingot A and ingot B, the grain size monotonically increases from a bottom portion of the brick to a top portion of the brick. For ingot A, the grain size (15.76 mm) at a brick height of 245 mm is 50% more than the grain size (10.26 mm) at a brick height of 95 mm. For ingot B, the grain size (16.97 mm) at a brick height of 207.5 mm is 45% more than the grain size (11.61 mm) at a brick height of 95 mm.

Referring to FIGS. 9A, 10A, 11A, 12A, and Table 1, a grain orientation mapping and a grain boundary mapping at a given height (95 mm in FIG. 9A, 132.5 mm in FIG. 10A, 170 mm in FIG. 11A, 207.5 mm in FIG. 12A) of Ingot B are shown. Table 1 records the ratio (in percentage) of grain orientations at different heights of a brick separated from ingot B. Grain orientations and grain boundary types are color-coded according to the annotations on the right of the figures. Referring to FIGS. 9B, 10B, 11B, 12B, and Table 1, a defect location mapping and a grain boundary mapping at a given height (95 mm in FIG. 9B, 132.5 mm in FIG. 10B, 170 mm in FIG. 11B, 207.5 mm in FIG. 12B) of Ingot B are shown. Table 1 records the ratio (in percentage) of grain boundary types at different heights of a brick separated from ingot B. Defects (shown in black) and grain boundary types are color-coded according to the annotations on the right of the figures.

Figure 13:
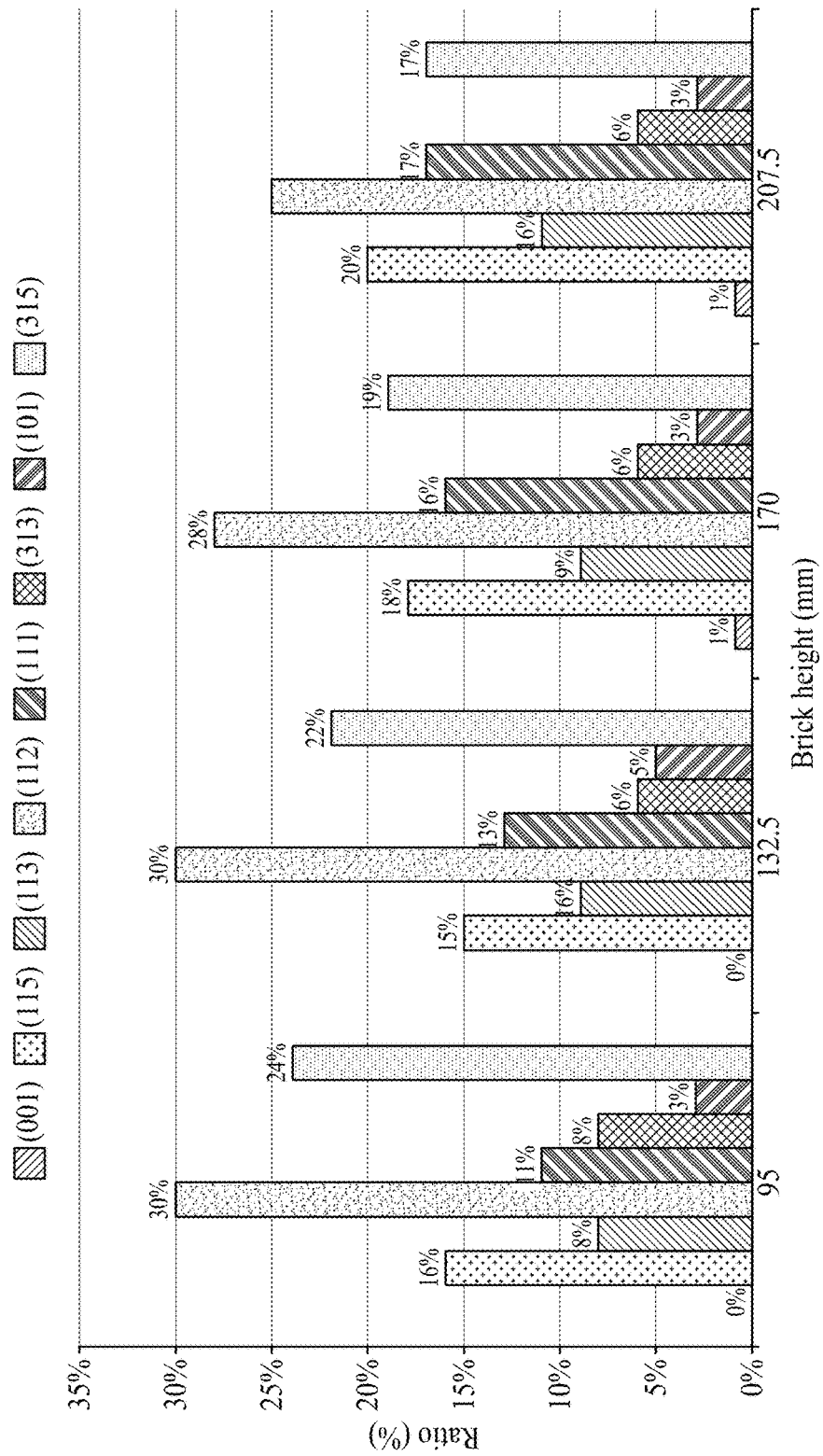
FIG. 13 shows the percentage of various grain orientations at given heights of Ingot B, in accordance with some embodiments.

Referring to FIG. 13, FIG. 13 shows a quantitative summary diagram in accordance with FIGS. 9A, 10A, 11A, and 12A. Distribution of the grain orientations at different heights of Ingot B is shown in FIG. 13. In some embodiments, the preferred orientation at various heights of Ingot B is {112}.

Figure 14:
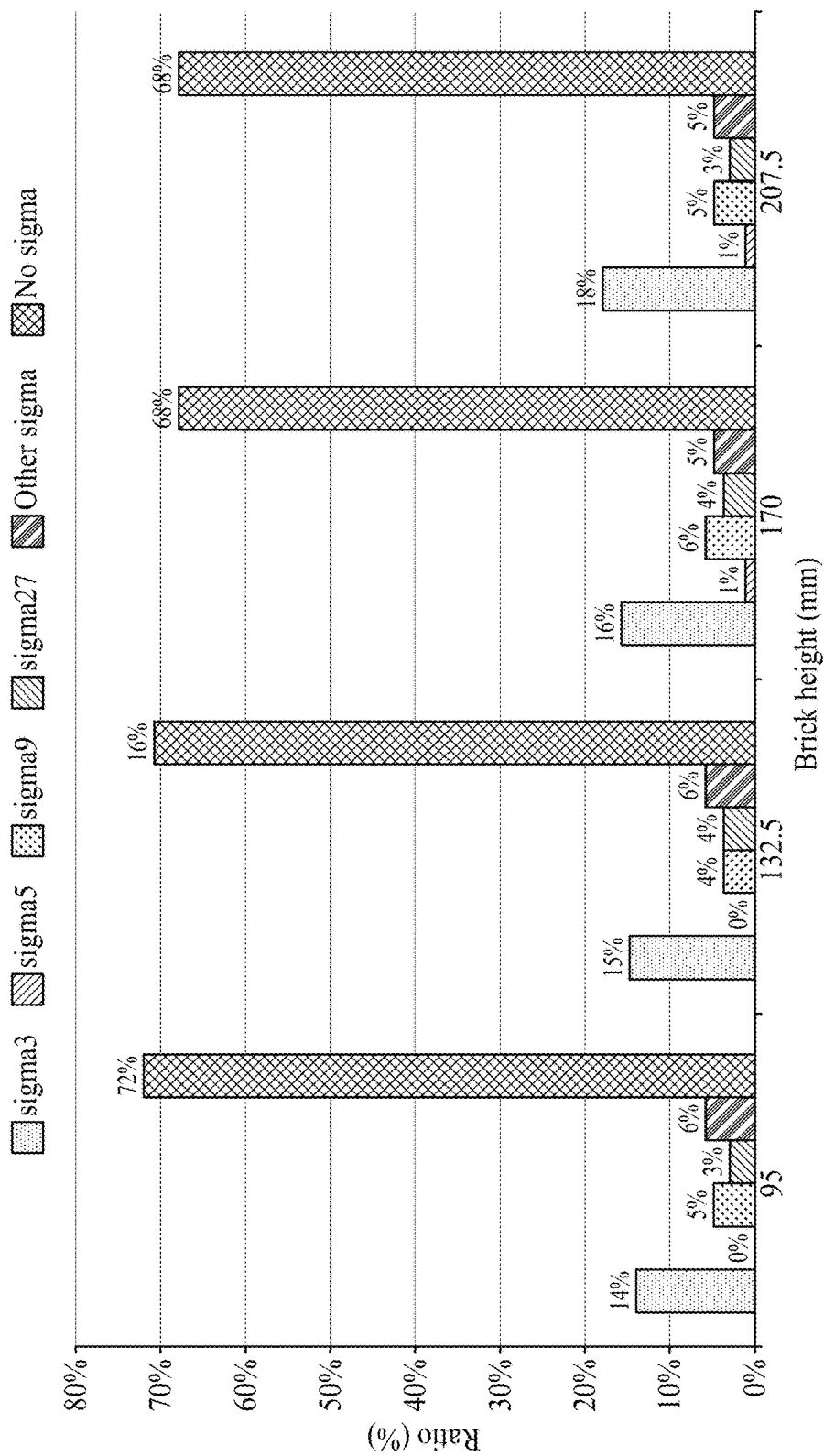
FIG. 14 shows the percentage of various grain boundary types at given heights of Ingot B, in accordance with some embodiments.
Figure 15A:
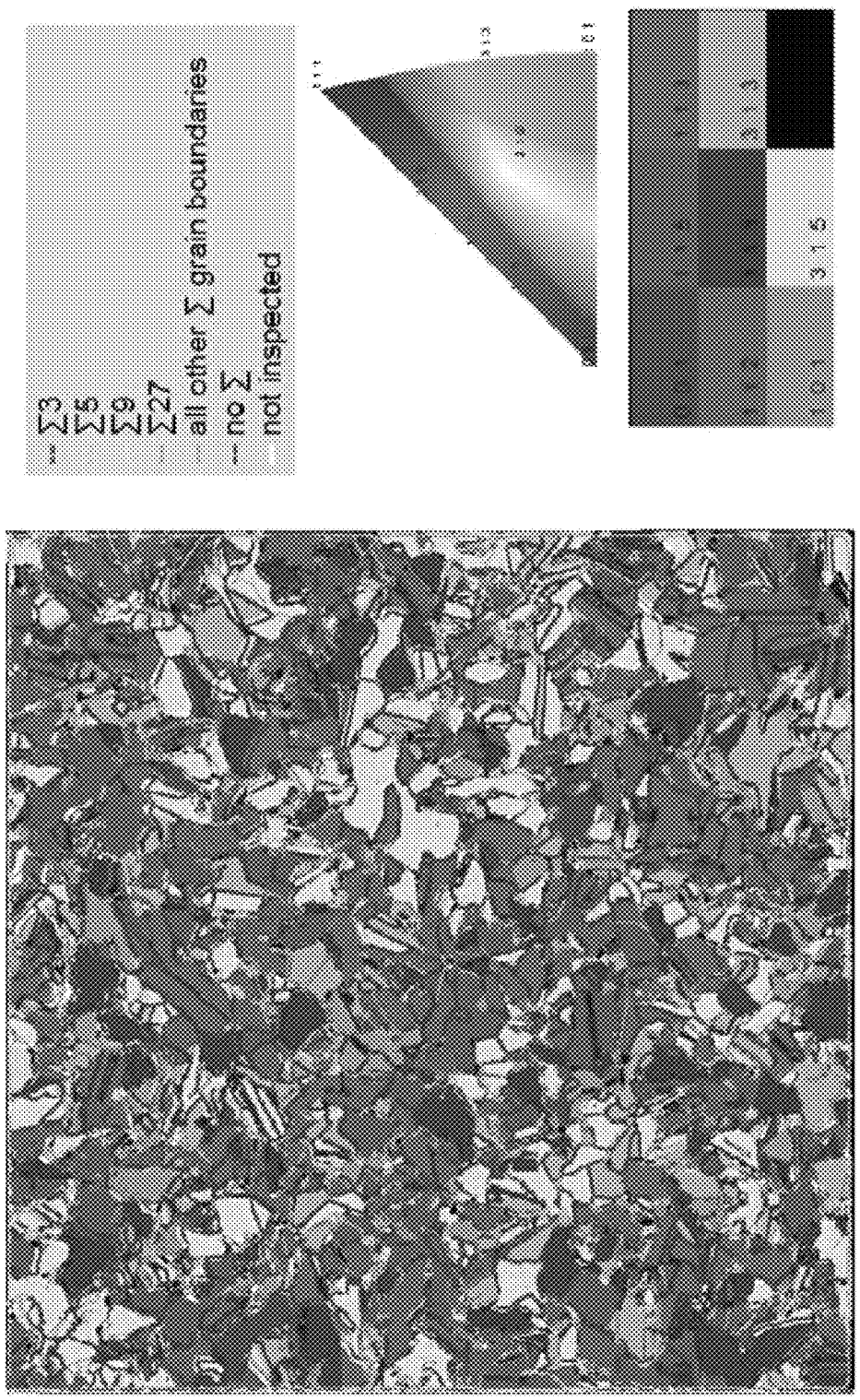
FIG. 15A shows grain orientation mappings and typical grain boundary mappings at a given height (95 mm) of Ingot A, in accordance with some embodiments.
Figure 15B:
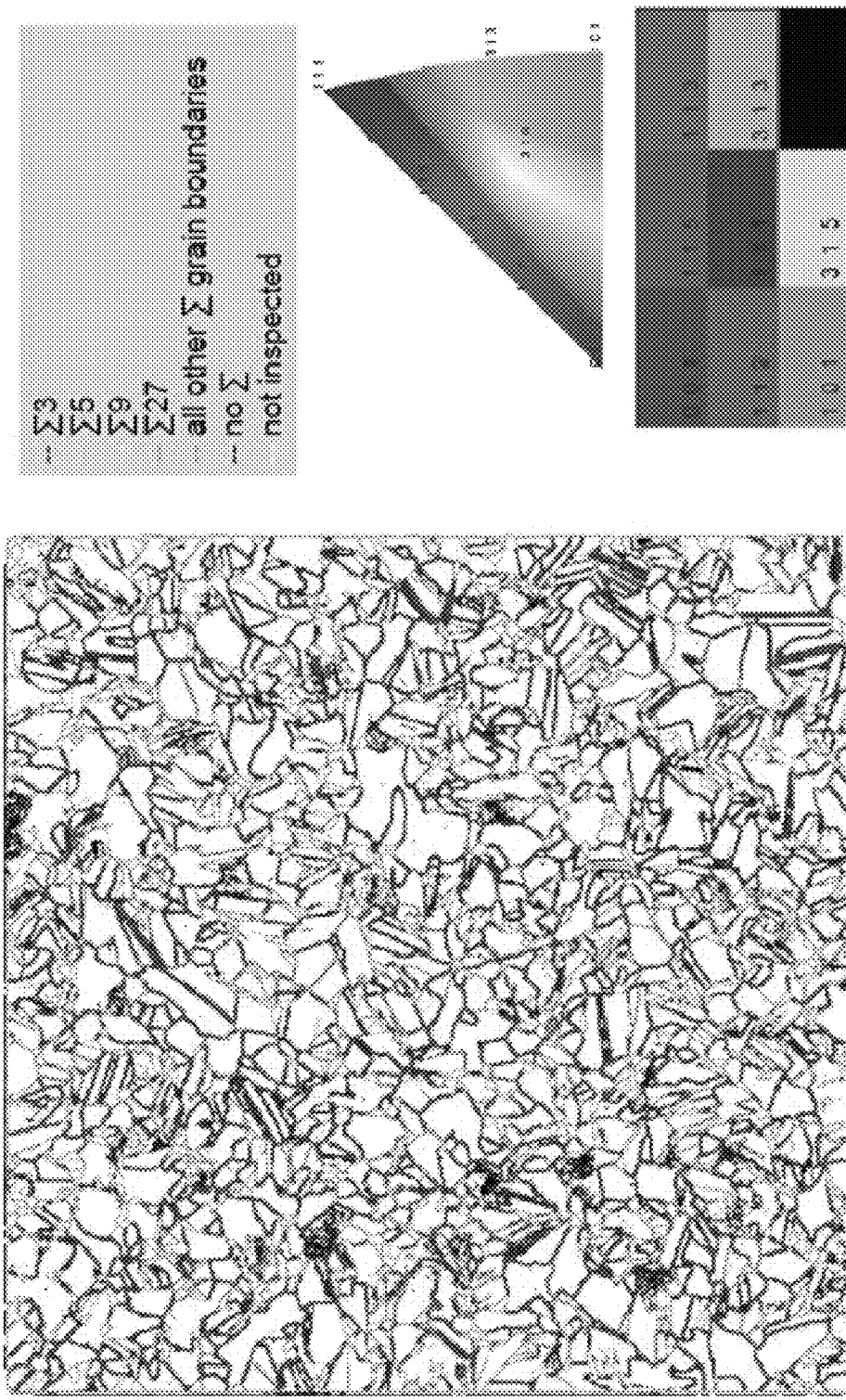
FIG. 15B shows defect location mapping and typical grain boundary mappings at a given height (95 mm) of Ingot A, in accordance with some embodiments.
Figure 16A:
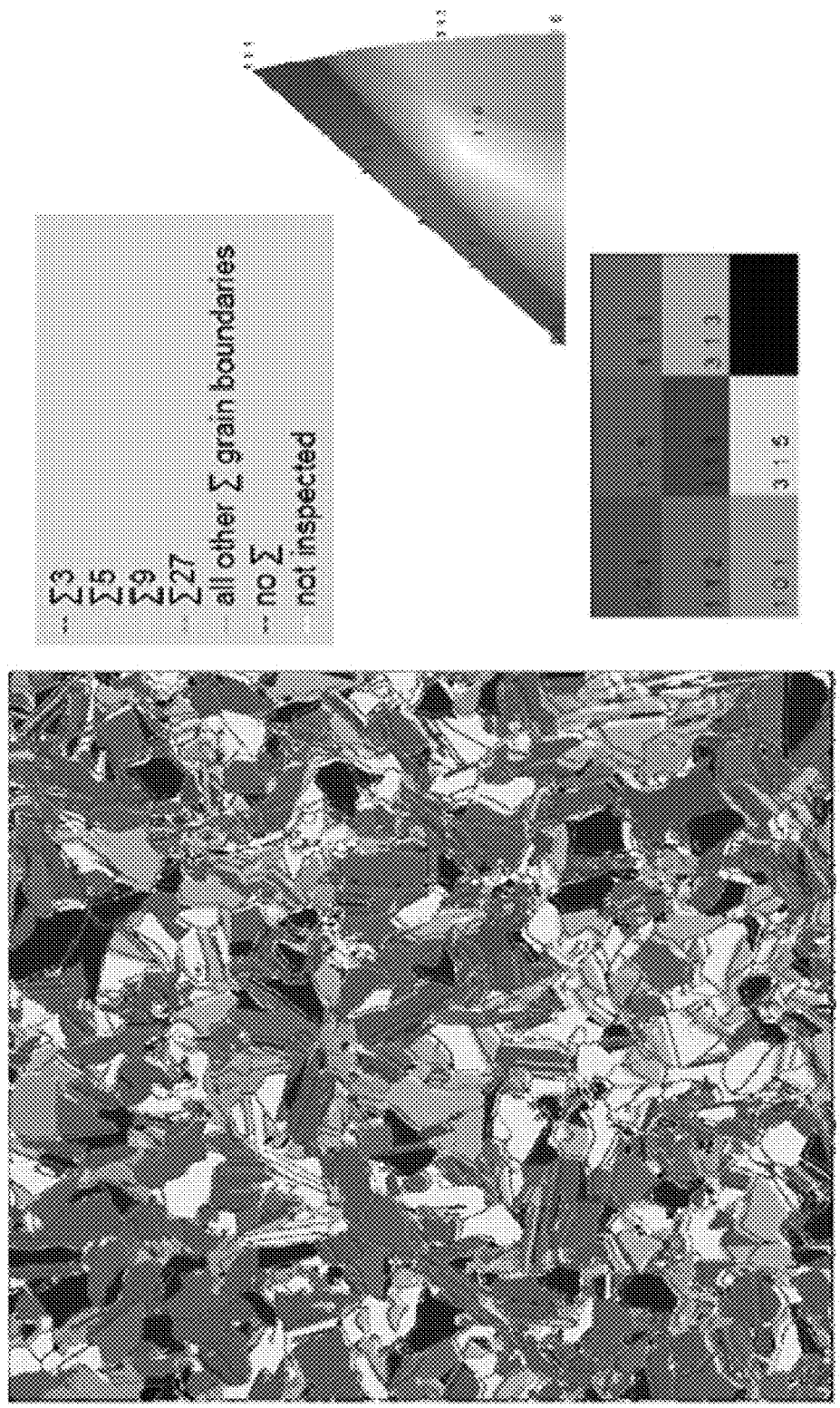
FIG. 16A shows grain orientation mappings and typical grain boundary mappings at a given height (132.5 mm) of Ingot A, in accordance with some embodiments.
Figure 16B:
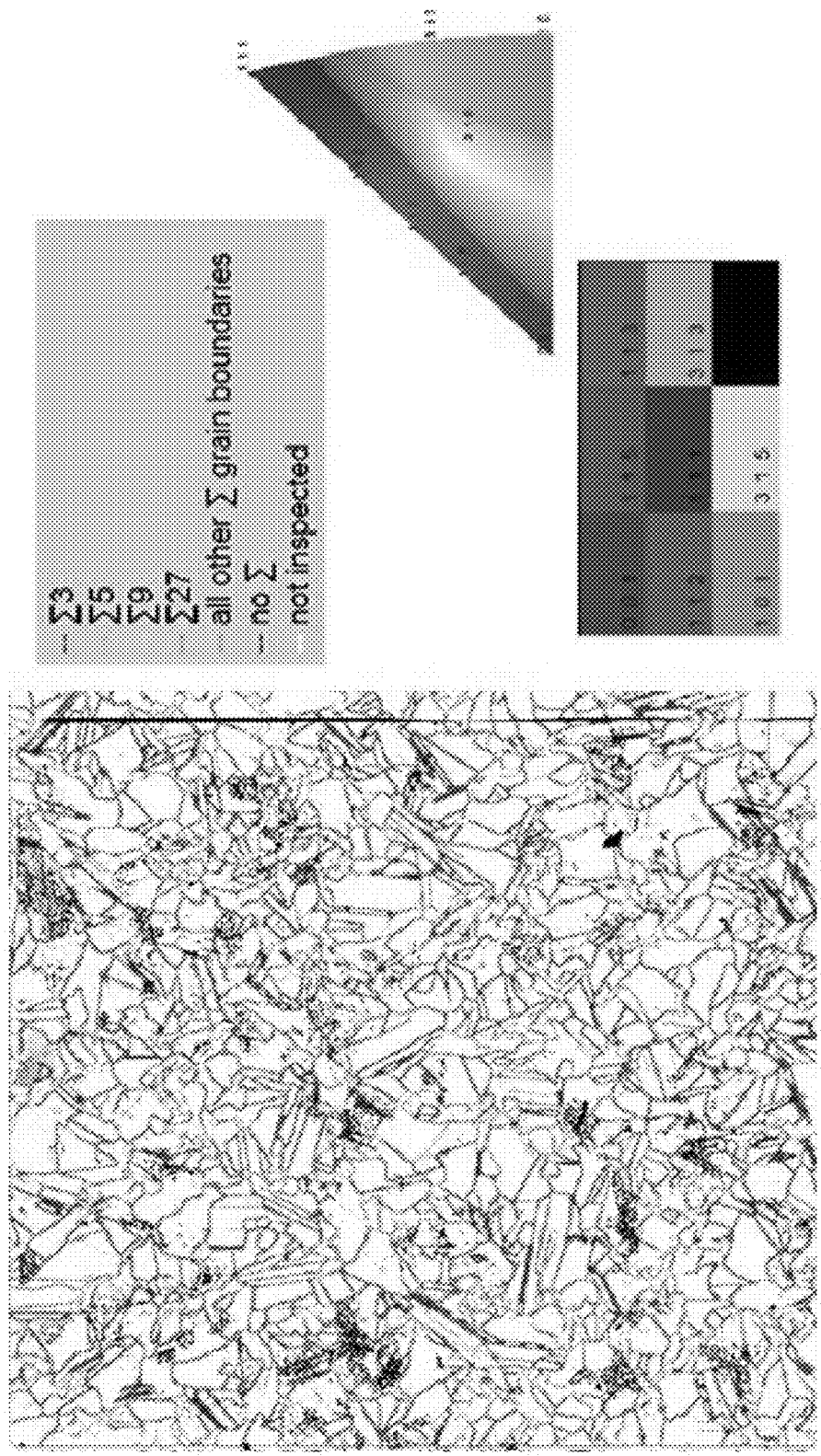
FIG. 16B shows defect location mapping and typical grain boundary mappings at a given height (132.5 mm) of Ingot A, in accordance with some embodiments.
Figure 17A:
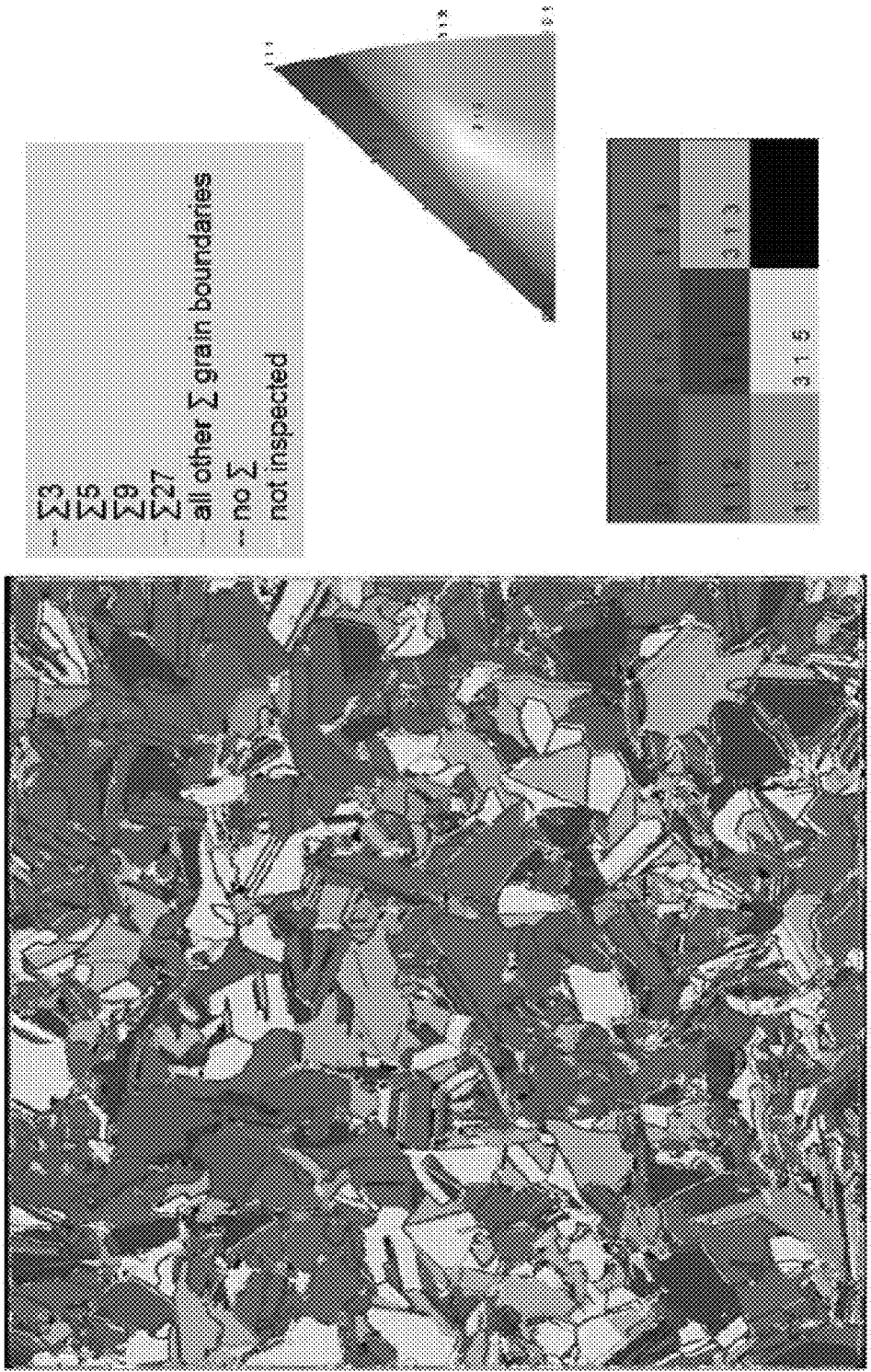
FIG. 17A shows grain orientation mappings and typical grain boundary mappings at a given height (170 mm) of Ingot A, in accordance with some embodiments.
Figure 17B:
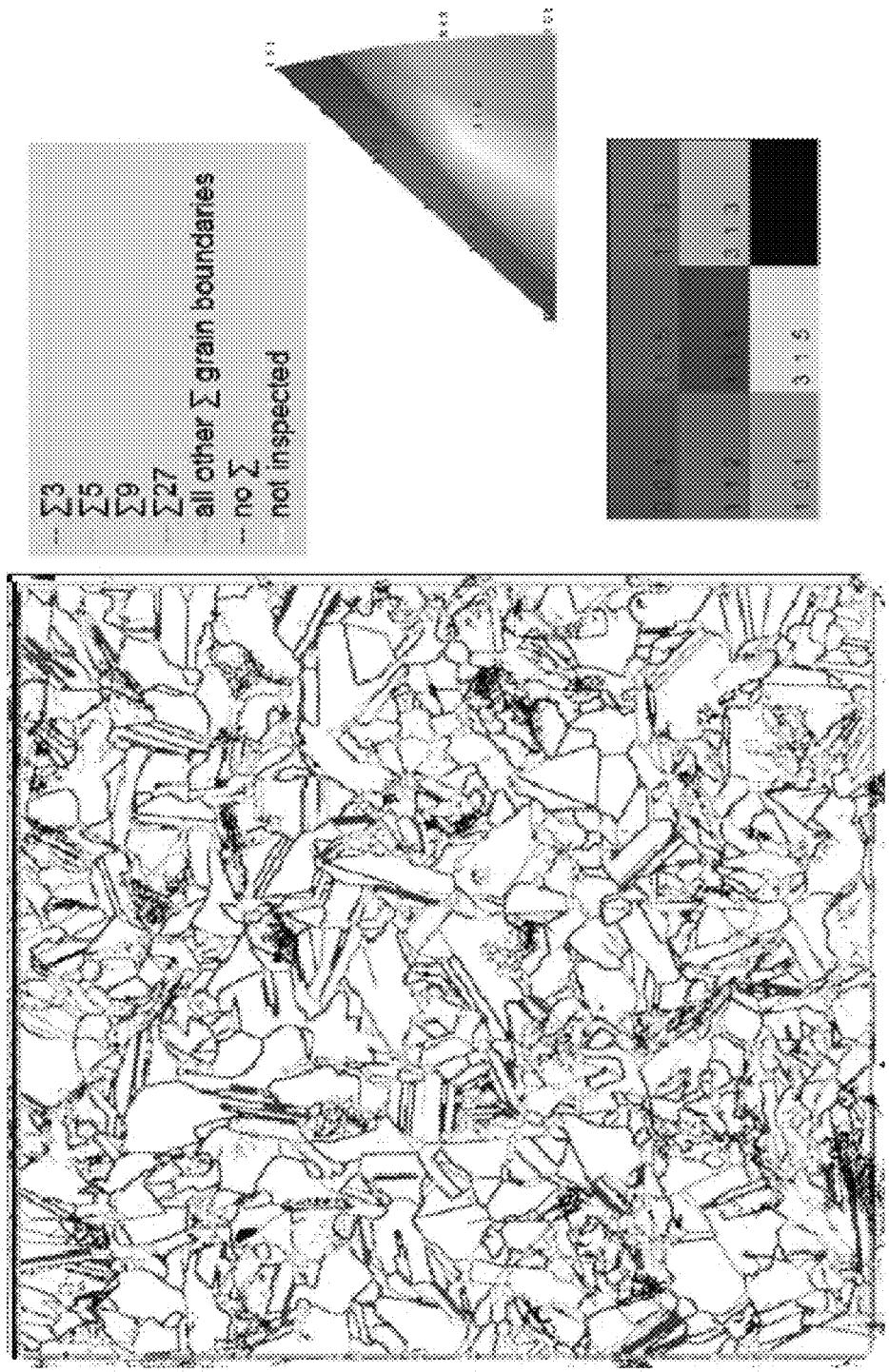
FIG. 17B shows defect location mapping and typical grain boundary mappings at a given height (170 mm) of Ingot A, in accordance with some embodiments.
Figure 18A:
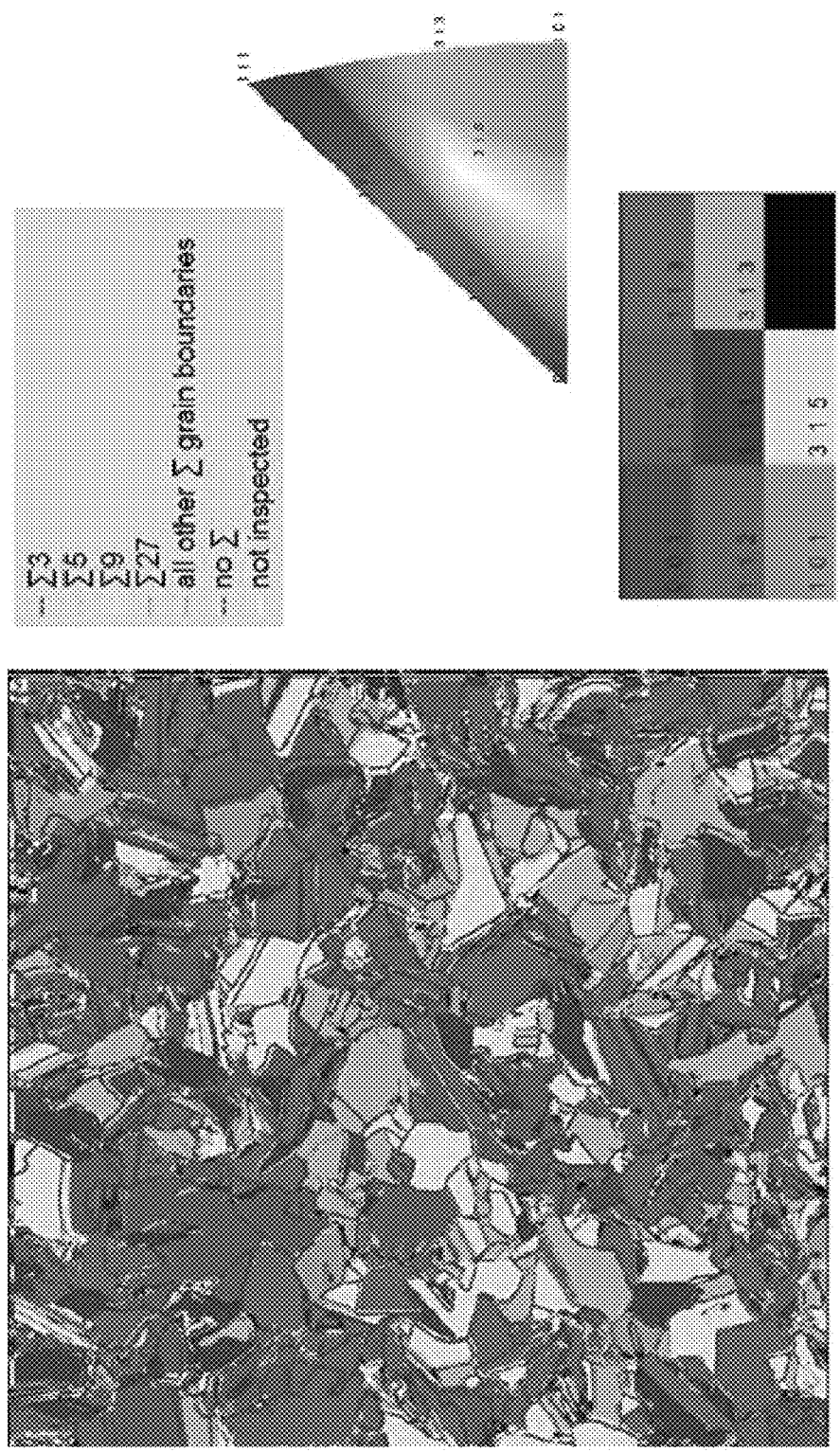
FIG. 18A shows grain orientation mappings and typical grain boundary mappings at a given height (207.5 mm) of Ingot A, in accordance with some embodiments.
Figure 18B:
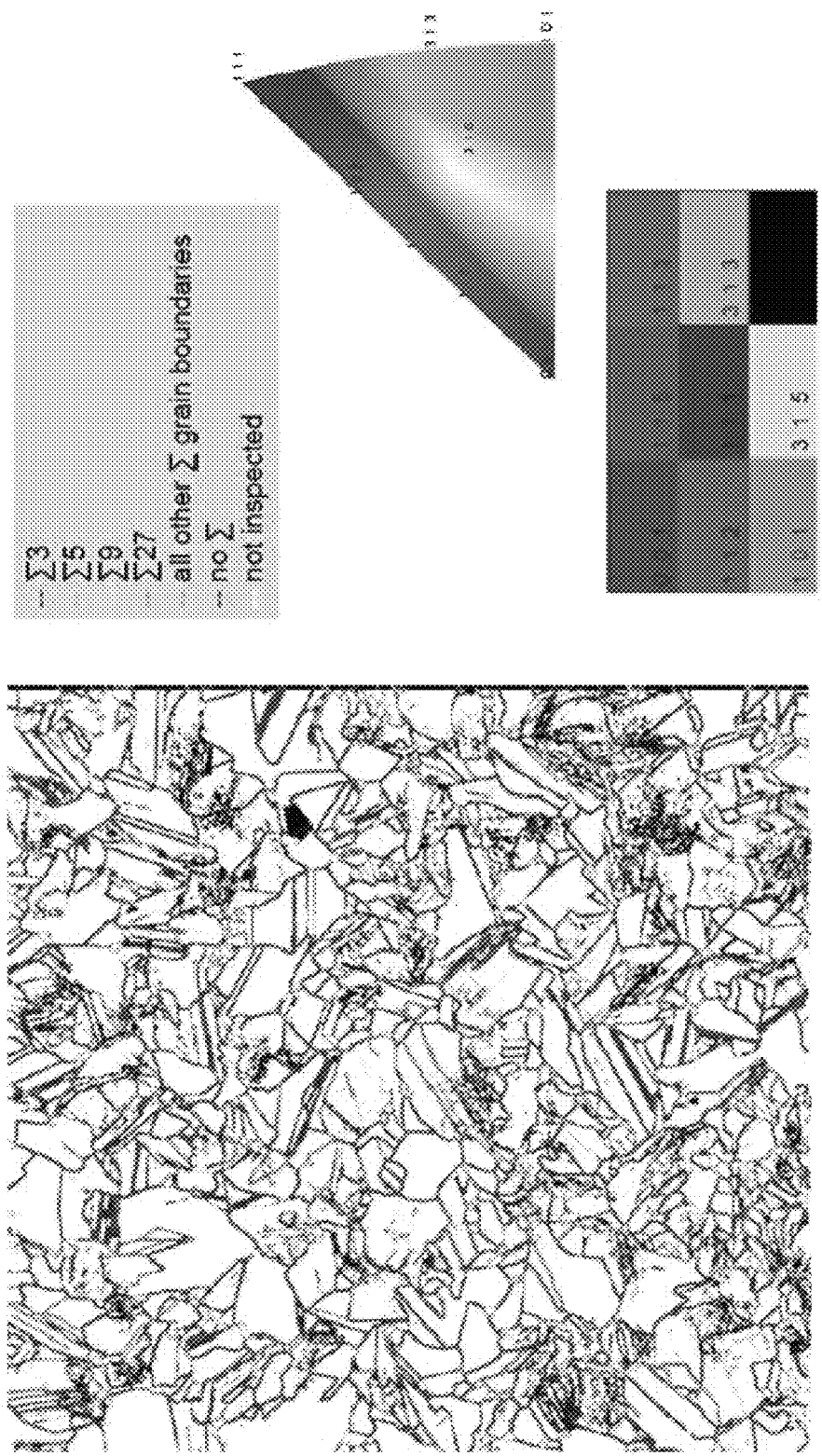
FIG. 18B shows defect location mapping and typical grain boundary mappings at a given height (207.5 mm) of Ingot A, in accordance with some embodiments.

Referring to FIG. 14, FIG. 14 shows a quantitative summary diagram in accordance with FIGS. 9B, 10B, 11B, and 12B. Distribution of grain boundary types at different height of Ingot B is shown in FIG. 14. The ratio (in percentage) of high-angle grain boundary (for example, non-Σ grain boundary) decreases as moving to a higher portion of the ingot (i.e. greater brick height). In some embodiments, the percentage of non-Σ grain boundary is from about 65 to about 75 at the bottom portion of an ingot. The percentage of more coherent grain boundary (for example, Σ3 grain boundary) increases as moving to a higher portion of the ingot. In some embodiments, the percentage of Σ3 grain boundary is from about 12 to about 18 at the bottom portion of an ingot. There are grain boundaries for which the coherency is in between Σ3 grain boundary and non-Σ grain boundary, for example, Σ5, Σ9, Σ27, other Σ (collectively other grain boundary more incoherent than the Σ3 grain boundary). As shown in FIG. 14, the percentage of Σ3 grain boundary being lower than the percentage of the non-Σ grain boundary and greater than other grain boundary being more incoherent than the Σ3 grain boundary. In some embodiments, the percentage of non-Σ grain boundary is greater than a summation of the percentage of Σ3 grain boundary and the percentage of other grain boundary being more incoherent than the Σ3 grain boundary.

Referring to FIGS. 15A, 16A, 17A, 18A, and Table 1, a grain orientation mapping and a grain boundary mapping at a given height (95 mm in FIG. 15A, 132.5 mm in FIG. 16A, 170 mm in FIG. 17A, 207.5 mm in FIG. 18A) of Ingot B are shown. Table 1 records the ratio (in percentage) of grain orientations at different heights of a brick separated from ingot B. Grain orientations and grain boundary types are color-coded according to the annotations on the right of the figures. Referring to FIGS. 15B, 16B, 17B, 18B, and Table 1, a defect location mapping and a grain boundary mapping at a given height (95 mm in FIG. 15B, 132.5 mm in FIG. 16B, 170 mm in FIG. 17B, 207.5 mm in FIG. 18B) of Ingot B are shown. Table 1 records the ratio (in percentage) of grain boundary types at different heights of a brick separated from ingot B. Defects (shown in black) and grain boundary types are color-coded according to the annotations on the right of the figures.

Figure 19:
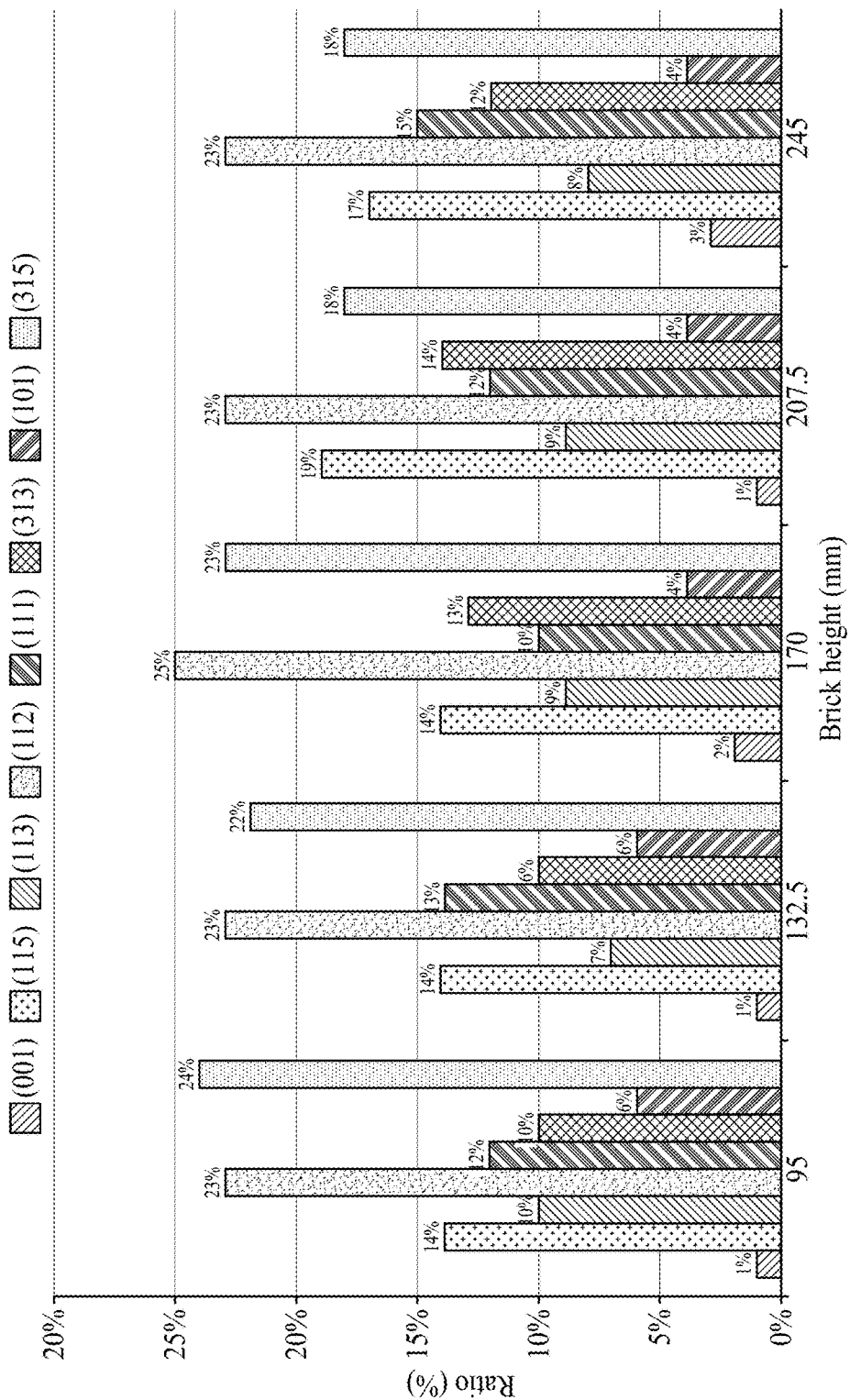
FIG. 19 shows the percentage of various grain orientations at given heights of Ingot A, in accordance with some embodiments.

Referring to FIG. 19, FIG. 19 shows a quantitative summary diagram in accordance with FIGS. 15A, 16A, 17A, and 18A. Distribution of the grain orientations at different heights of Ingot B is shown in FIG. 19. In some embodiments, the preferred orientation at various heights of Ingot B is {112}.

Figure 20:
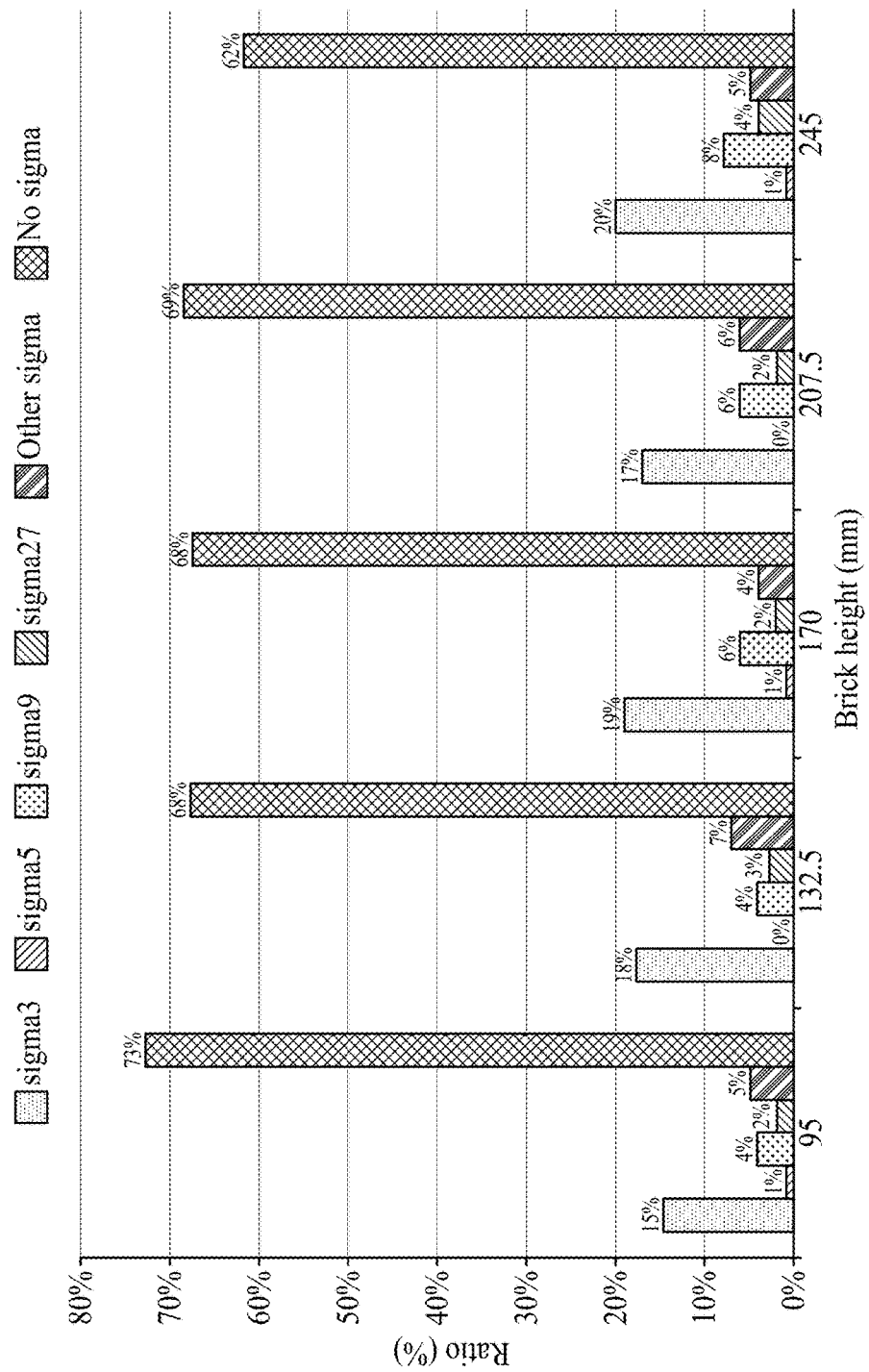
FIG. 20 shows the percentage of various grain boundary types at given heights of Ingot A, in accordance with some embodiments.

Referring to FIG. 20, FIG. 20 shows a quantitative summary diagram in accordance with FIGS. 15B, 16B, 17B, and 18B, Distribution of grain boundary types at different heights of Ingot B is shown in FIG. 14. The ratio (in percentage) of high-angle grain boundary (for example, non-Σ grain boundary) decreases as moving to a higher portion of the ingot (i.e. greater brick height). The position of a multicrystalline silicon (mc-Si) wafer on an ingot can be determined according to resistance analysis. In general, a mc-Si wafer in proximity to a bottom of an ingot or a brick has a greater resistance than a mc-Si wafer in proximity to a top of the ingot or the brick. In some embodiments, the percentage of non-Σ grain boundary is from about 65 to about 75 in a mc-Si wafer. In other embodiments, the percentage of Σ3 grain boundary is from about 12 to about 25 in a mc-Si wafer. Furthermore, the aforesaid wafer may be separated from a bottom portion of an ingot or brick. Referring back to FIG. 5, in addition to Σ3 grain boundary, another type of coherent grain boundary, namely twin boundary, can be observed in a mc-Si wafer prepared according to the method described herein. In some embodiments, the percentage of the Σ3 grain boundary is substantially the same as a percentage of the twin boundary in a mc-Si wafer. The aforesaid wafer may be separated from a bottom portion of an ingot or brick.

Table 1 below provides complementary information for FIG. 8, FIG. 13, FIG. 14, FIG. 19, and FIG. 20 of the present disclosure. The information encompassed in figures listed above is presented in the context of a Table for clarity.

TABLE 1

Complementary Data of FIG. 8, FIG. 13, FIG. 14, FIG. 19, and FIG. 20

| Position (mm) | Grain size (mm) | Grain boundary type ratio | | | | | | Grain orientation ratio | | | | | | | |
| --- | --- | --- | --- | --- | --- | --- | --- | --- | --- | --- | --- | --- | --- | --- | --- |
| | | Σ3 | Σ5 | Σ9 | Σ27 | Other Σ | Non Σ | (001) | (115) | (113) | (112) | (111) | (313) | (101) | (315) |
| Ingot A | | | | | | | | | | | | | | | |
| 95 | 10.26 | 15% | 1% | 4% | 2% | 5% | 73% | 1% | 14% | 10% | 23% | 12% | 10% | 6% | 24% |
| 132.5 | 12.25 | 18% | 0% | 4% | 3% | 7% | 68% | 1% | 14% | 7% | 23% | 14% | 13% | 6% | 22% |
| 170 | 12.98 | 19% | 1% | 6% | 2% | 4% | 68% | 2% | 14% | 9% | 25% | 10% | 13% | 4% | 23% |
| 207.5 | 15.21 | 17% | 0% | 6% | 2% | 6% | 69% | 1% | 19% | 9% | 23% | 12% | 14% | 4% | 18% |
| 245 | 15.76 | 20% | 1% | 8% | 4% | 5% | 62% | 3% | 17% | 8% | 23% | 15% | 12% | 4% | 18% |
| Ingot B | | | | | | | | | | | | | | | |
| 95 | 11.61 | 14% | 0% | 5% | 3% | 6% | 72% | 0% | 16% | 8% | 30% | 11% | 8% | 3% | 24% |
| 132.5 | 12.25 | 15% | 0% | 4% | 4% | 6% | 71% | 0% | 15% | 9% | 30% | 13% | 6% | 5% | 22% |
| 170 | 13.37 | 16% | 1% | 6% | 4% | 5% | 68% | 1% | 18% | 9% | 28% | 16% | 6% | 3% | 19% |
| 207.5 | 16.97 | 18% | 1% | 5% | 3% | 5% | 68% | 1% | 20% | 11% | 25% | 17% | 6% | 3% | 17% |

Some embodiments of the present disclosure provides a multicrystalline silicon (mc-Si) brick, including a bottom portion starting from a bottom to a height of 100 mm, a middle portion starting from the height of 100 mm to a height of 200 mm; and a top portion starting from the height of 200 mm to a top. A percentage of incoherent grain boundary in the bottom portion is greater than a percentage of incoherent grain boundary in the top portion.

In some embodiments, the mc-Si brick further including a preferred grain orientation of {112} in the bottom portion, the middle portion, and the top portion.

In some embodiments, the incoherent grain boundary includes non-$\Sigma$ grain boundaries.

In some embodiments, a percentage of coherent grain boundary in the bottom portion is lower than a percentage of coherent grain boundary in the top portion.

In some embodiments, the coherent grain boundary includes $\Sigma 3$ grain boundary.

'In some embodiments, the percentage of $\Sigma 3$ grain boundary being lower than the percentage of the non-$\Sigma$ grain boundary and greater than other grain boundary being more incoherent than the $\Sigma 3$ grain boundary.

In some embodiments, the percentage of non-$\Sigma$ grain boundaries is from about 65 to about 75 at the bottom portion.

In some embodiments, the percentage of non-$\Sigma$ grain boundary is greater than a summation of the percentage of $\Sigma 3$ grain boundary and the percentage of other grain boundary being more incoherent than the $\Sigma 3$ grain boundary.

In some embodiments, the percentage of $\Sigma 3$ grain boundaries is from about 12 to about 18 at the bottom portion.

In some embodiments, the mc-Si brick further including a nucleation promotion layer under the bottom portion, wherein the nucleation promotion layer includes a plurality of beads.

In some embodiments, the beads include an average diameter smaller than about 10 mm.

In some embodiments, the beads include single crystalline silicon, multicrystalline silicon, silicon carbide, or combinations thereof.

In some embodiments, an angle between a pole direction of a first single crystalline silicon bead and a normal to the bottom of the multicrystalline silicon ingot is different from an angle between a pole direction of a second single crystalline silicon bead and the normal to the bottom of the multicrystalline silicon ingot.

Some embodiments of the present disclosure provide a multicrystalline silicon (mc-Si) wafer. The mc-Si wafer includes a percentage of non-$\Sigma$ grain boundary from about 60 to about 75 and a percentage of $\Sigma 3$ grain boundary from about 12 to about 25.

In some embodiments, a preferred crystal orientation of the mc-Si wafer includes {112}.

In some embodiments, the mc-Si wafer further includes a twin boundary, wherein the percentage of the $\Sigma 3$ grain boundary is substantially the same as a percentage of the twin boundary.

Some embodiments of the present disclosure provide a multicrystalline silicon (mc-Si) wafer. A percentage of non-$\Sigma$ grain boundary and a percentage of $\Sigma 3$ grain boundary in the mc-Si wafer are substantially identical.

In some embodiments, the percentage of non-$\Sigma$ grain boundary and the percentage of $\Sigma 3$ grain boundary in the mc-Si wafer are in a range of from about 40 to about 50.

In some embodiments, a preferred crystal orientation of the mc-Si wafer includes {112}.

In some embodiments, the mc-Si wafer further includes a twin boundary, wherein the percentage of the $\Sigma 3$ grain boundary is substantially the same as a percentage of the twin boundary.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A multicrystalline silicon wafer, comprising a percentage of non-$\Sigma$ grain boundary from about 60 to about 75 and a percentage of $\Sigma 3$ grain boundary from about 12 to about 25.

2. The multicrystalline silicon wafer of claim 1, wherein a preferred crystal orientation comprises {112}.

3. The multicrystalline silicon wafer of claim 1, further comprising a twin boundary, wherein the percentage of the $\Sigma 3$ grain boundary is substantially the same as a percentage of the twin boundary.

4. A multicrystalline silicon wafer, wherein a percentage of non-$\Sigma$ grain boundary and a percentage of $\Sigma 3$ grain boundary are substantially identical.

5. The multicrystalline silicon wafer of claim 4, wherein the percentage of non-$\Sigma$ grain boundary and the percentage of $\Sigma 3$ grain boundary are in a range of from about 40 to about 50.

6. The multicrystalline silicon wafer of claim 4, wherein a preferred crystal orientation comprises {112}.

7. The multicrystalline silicon wafer of claim 4, further comprising a twin boundary, wherein the percentage of the $\Sigma 3$ grain boundary is substantially the same as a percentage of the twin boundary.

* * * * *